(12) United States Patent
Dueber et al.

(10) Patent No.: US 7,745,516 B2
(45) Date of Patent: Jun. 29, 2010

(54) COMPOSITION OF POLYIMIDE AND STERICALLY-HINDERED HYDROPHOBIC EPOXY

(75) Inventors: Thomas Eugene Dueber, Wilmington, DE (US); John D. Summers, Chapel Hill, NC (US); Brian C. Auman, Pickerington, OH (US); Munirpallam Appadorai Subramanian, Corvallis, OR (US); Nyrissa S. Rogado, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 449 days.

(21) Appl. No.: 11/248,803

(22) Filed: Oct. 12, 2005

(65) Prior Publication Data
US 2007/0083017 A1    Apr. 12, 2007

(51) Int. Cl.
*C08K 5/05* (2006.01)
*C08K 5/10* (2006.01)
*C08K 5/103* (2006.01)
*C08L 79/08* (2006.01)
*B32B 15/08* (2006.01)

(52) U.S. Cl. .................. 523/455; 523/445; 523/456; 523/457; 523/458; 523/466; 523/468; 525/423; 428/416

(58) Field of Classification Search .................. None
See application file for complete search history.

(56) References Cited

U.S. PATENT DOCUMENTS

| 4,985,377 | A | 1/1991 | Iseki et al. | |
|---|---|---|---|---|
| 5,750,958 | A | 5/1998 | Okuda et al. | |
| 5,980,785 | A | 11/1999 | Xi et al. | |
| 6,143,423 | A * | 11/2000 | Shiobara et al. | 428/620 |
| 6,723,420 | B2 | 4/2004 | Petkie | |
| 7,348,373 | B2 * | 3/2008 | Dueber et al. | 524/107 |
| 2002/0002310 | A1 | 1/2002 | Grenacher et al. | |
| 2002/0022310 | A1* | 2/2002 | Han et al. | 438/200 |
| 2005/0154181 | A1 | 7/2005 | Dueber et al. | |

FOREIGN PATENT DOCUMENTS

| EP | 0 171 157 A2 | | 2/1986 |
|---|---|---|---|
| EP | 0 397 582 A1 | | 11/1990 |
| JP | 62-151458 A | * | 7/1987 |
| JP | 4-61703 A | * | 2/1992 |
| JP | 7-224152 A | * | 8/1995 |
| JP | 7-247339 A | * | 9/1995 |
| JP | 11060947 | | 3/1999 |
| JP | 2003-155325 A | * | 5/2003 |
| JP | 2005-113059 A | * | 4/2005 |
| WO | WO 00/34388 A1 | | 6/2000 |

OTHER PUBLICATIONS

Derwent accession No. 2005-551308 for Euopean Patent No. 1,553,134 and U.S. 7,348,373, Dueber et al., Jul. 13, 2005, two pages.*
Dow Chemical Company technical data sheet for Dowanol PPh, propylene glycol phenyl ether, Mar. 2008, two pages.*

* cited by examiner

*Primary Examiner*—Robert Sellers

(57) ABSTRACT

Water absorption resistant polyimide/epoxy-based compositions, like pastes (or solutions), are particularly useful to make electronic screen-printable materials and electronic components. A group of hydrophobic epoxies (and soluble polyimides) was discovered to be particularly resistant to moisture absorption. The polyimide/epoxy pastes made with these epoxies (and these polyimides) may optionally contain thermal crosslinking agents, adhesion promoting agents, blocked isocyanates, and other inorganic fillers. The polyimide/epoxy pastes of the present invention can have a glass transition temperature greater than 250° C., a water absorption factor of less than 2%, and a positive solubility measurement.

28 Claims, No Drawings

COMPOSITION OF POLYIMIDE AND STERICALLY-HINDERED HYDROPHOBIC EPOXY

FIELD OF INVENTION

The present invention relates generally to compositions having a polyimide component and a hydrophobic epoxy component, such compositions being useful as a binder component in a resistor, resistor substrate, or other electronic substrate or similar-type application. More specifically, the polyimide/epoxy based liquids, solutions, suspensions and/or pastes (hereafter, simply referred to as "pastes") of the present invention can generally be screen printed or otherwise formed into an electronic substrate, pattern or device, to provide a final material having low water sorption properties (relative to known prior art compositions) for improved performance in certain electronics type applications.

BACKGROUND OF THE INVENTION

U.S. Pat. No. 5,980,785 to Xi, et al. broadly teaches compositions useful in electronic applications created by screen-printing pastes, followed by heat and/or chemical reaction induced solidification. However as the electronics industry advances, many such pastes must be increasingly resistant to water sorption in high humidity, high temperature environments.

Furthermore, when a resistor film is screen printed and solidified upon a conductive substrate, a reliable and stable bond must be formed at the interface (between the conductive substrate and the resistor film). If not, resistor properties can tend to drift or otherwise become problematic. If a traditional PTF resistor film is bonded directly to a copper trace, the resistance properties will generally drift, due to instability and unreliability at the resistor/conductor interface. Consequently, before conventional resistor films are applied to a copper trace, the copper trace is typically plated with silver (e.g., the copper trace is first exposed to a silver immersion plating process), since silver at the interface (between the resistor film and the copper trace) will generally provide a more stable and reliable interface, resulting in improved resistor performance. However, silver plating can be expensive and can add to the overall complexity of the manufacturing process. A need therefore also exists for resistor film compositions capable of being applied directly to copper traces with improved interface reliability and stability, relative to known resistor film compositions.

SUMMARY OF THE INVENTION

The present invention is directed to binder compositions comprising a polyimide component, a sterically hindered hydrophobic epoxy and an organic solvent. In one representative embodiment, the binder further comprises (in addition to the solvent and 'polyimide/epoxy component') an electrically conductive material, a cross-linking agent, an adhesion promoter and/or other useful filler components.

In one embodiment of the present invention, the polyimide component can be represented by the formula,

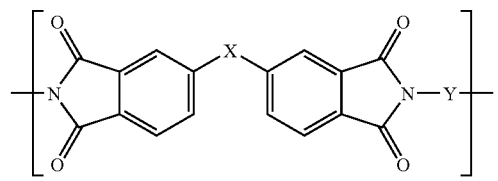

where X can be equal to $SO_2$, $C(CF_3)_2$ $C(CF_3)$phenyl, $C(CF_3)$ $CF_2CF_3$, $C(CF_2CF_3)$phenyl (and combinations thereof; and where Y is derived from a diamine component comprising from 2 to 50 mole percent of a phenolic-containing diamine selected from the group consisting of, 2,2'-bis(3-amino-4-hydroxyphenyl)hexafluoropropane (6F-AP), 3,3'-dihydroxy-4,4'-diaminobiphenyl (HAB), 2,4-diaminophenol, 2,3-diaminophenol, 3,3'-diamino-4,4'-dihydroxy-biphenyl, and 2,2'-bis(3-amino-4-hydroxyphenyl).

In one embodiment of the present invention, a sterically hindered hydrophobic epoxy, which can be represented by the following formula,

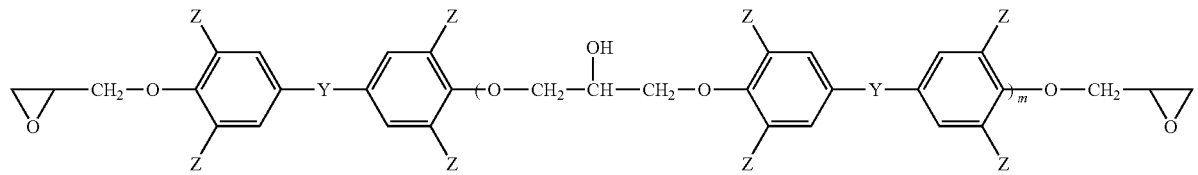

where z is an alkyl, alkoxy, phenyl, phenoxy, halogen, or combinations thereof; where Y can be a covalent bond, oxygen, sulfur, methylene, fluorenylidene, ethylidene, sulfonyl, cyclohexylidene, 1-phenylethylidene, $C(CH_3)_2$ or $C(CF_3)_2$; where m is an integer between and including any two of the following numbers, 0, 1, 2, 3, 4 and 5, and can be mixed with the polyimide component to form a useful polymer solution (i.e. a 'binder component' or as disclosed herein a 'polyimide/epoxy component').

DETAILED DESCRIPTION OF THE PREFERRED EMBODIMENTS

In one embodiment of the present invention, an electrically conductive material is added to the polyimide/epoxy component (or a precursor thereto) to form a 'paste'. Such electrically conductive composite materials can comprise carbon (e.g., graphite), metal, or metal oxide. Useful metal oxides include oxides of a metal selected from the group consisting of Ru, Pt, Ir, Sr, La, Nd, Ca, Cu, Bi, Gd, Mo, Nb, Cr and Ti.

In one embodiment of the present invention, an organic solvent is used to minimize water sorption and improve other properties. Organic solvents found to be useful in the practice of the present invention include a liquid capable of suspending or dissolving the polyimide component, the epoxy component or both components. These organic solvents can have a Hanson polar solubility parameter between and including any two of the following numbers 2.1, 2.2, 2.3, 2.4, 2.5, 2.6, 2.7, 2.8, 2.9 and 3.0 and can have a normal boiling point between and including any two of the following numbers 210, 220, 230, 240, 250 and 260° C.

In one embodiment of the present invention, the polyimide component, the epoxy component, and optionally an electrically conductive material can be combined (with an appropriate organic solvent) to form a paste. As used herein a "paste" is intended to include solutions, suspensions or otherwise a homogeneous or non-homogeneous blending of either a polyimide/epoxy component or a polyimide/epoxy component also comprising electrically conductive materials and other optional materials.

In one embodiment of the present invention the pastes (or binders) can be combined with a thermal cross-linking agent. In another embodiment, the polyimide component (and/or epoxy component) can further comprise a crosslinkable site (by incorporation of a monomer capable of chemically crosslinking) in the polymer backbone of that material, for example, to make the polymer more rigid and/or improve its solvent resistance. In some embodiments of the present invention, it may be useful for the pastes disclosed herein to further comprise a blocked isocyanate, an adhesion promoter, and/or other useful inorganic fillers (including but not limited to other metals or metal oxides).

The present invention is also directed to embodiments, e.g., pastes or binder components, comprising a polyimide component having a glass transition temperature greater than 250, 260, 270, 280, 290 or 300° C. and a suitable organic solvent wherein the polyimide component, in the organic solvent, exhibits a positive solubility measurement.

The term, "positive moisture solubility" is intended to define a polyimide/epoxy solution containing 10% solids that is stable in an environment with a relative humidity of about 85% for a period greater than or equal to eight (8) hours at room temperature. The moisture solubility measurement is a test Applicants used to measure the polyimide/epoxy solution stability in a high moisture environment. The stability of the polyimide/epoxy solutions in high moisture environments is important because processing of the liquid or paste compositions, which involves ingredient mixing, 3 roll milling and screen printing, can take from 2 hours and up to 8 hours. During this time, the polyimide component or epoxy component generally should not precipitate in the liquid or paste compositions.

The compositions of the present invention can generally be used in many types of electronic circuitry type applications. In particular, the compositions can generally be used to produce electronic components such as resistors, but can also be used as discrete or planar capacitors, inductors, encapsulants, conductive adhesives, dielectric films and coatings, and electrical and thermal conductors. In one embodiment, the present invention is directed toward low water sorption, stable polyimide-based pastes that comprise certain hydrophobic epoxies. These materials can be used to prepare resistor materials, capacitors, and other electronic materials. The compositions of the present invention can be applied to a variety of substrate materials to make embedded passive-type resistors or other related planar (either embedded or non-embedded) electronic components. One type of electronic component is a polymer thick film (PTF) resistor. These resistors are typically formed using screen-printable liquids or pastes.

In one embodiment of the present invention, a PTF resistor composition is made from a screen-printable resistor paste composition of the present invention. The resistor paste composition is derived from a polyimide-based paste, a hydrophobic epoxy and an electrically conductive material (e.g., metal oxides and/or carbon, graphites, and carbon nanotube, and carbon nanofiber materials).

The PTF resistor paste can be applied on a suitable substrate using screen-printing (including stencil printing) or any other similar-type technique. Following a drying process, the printed pastes can be cured at relatively low temperatures to remove the solvent. The paste will tend to shrink and compress the conductive particles together,. resulting in electrical conductivity between the particles. The electrical resistance of the system tends to depend on the resistance of the materials incorporated into the polymer binder, their particle sizes and loading, as well as the nature of the polymer binder itself.

The electrical resistance of a PTF resistors formed in this fashion is very much dependent on the distances between the electrically conductive particles. The PTF resistors of the present invention require physical stability of the polymer binder when exposed to high temperatures and high moisture environments. This is important, so that there is no appreciable or undue change in the electrical resistance of the resistor.

PTF resistor stability can be measured by several known test measurements, including exposing the resistor to environments at 85° C. and 85% relative humidity to show accelerated aging, thermal cycling performance, as well as resistance to the exposure of soldering materials. The high performance PTF resistors of the present invention will typically exhibit little, if any, meaningful change in resistance following these tests. PTF materials may also encounter multiple exposures to solder with wave and re-flow solder operations. These thermal excursions are also a source of instability for traditional PTF resistors, particularly when printed directly on copper.

For PTF resistors, the addition of an epoxy component can improve adhesion to chemically cleaned copper or other metals. This improvement in adhesion can greatly improve the performance of PTF resistors to solder exposure and to accelerated thermal aging. Both thermal cycling, from −25° C. to +125° C., and for 85° C./85% RH thermal cycling performance was significantly improved. The combinations of the polyimides and the epoxies disclosed herein can improve PTF resistors sufficiently that the expensive multi-step immersion silver treatment of a copper (or other metals) may not be necessary.

In many applications (depending upon the particular design requirements of any particular embodiment of the present invention), the resistor films of the present invention can oftentimes provide a sufficiently stable and reliable interface when bonded directly to a copper trace, simply referred to herein as "non metal-plated copper" (e.g., no silver immersion plating process applied to the copper prior to resistor film application). The omission of the silver-plating process will tend to lower overall cost and complexity in the use of the present invention.

Polyimides are generally prepared from a dianhydride, or the corresponding diacid-diester, diacid halide ester, or tetracarboxylic acid derivative of the dianhydride, and a diamine. For purposes of the present invention, particular dianhydrides and a particular range of particular diamines were discovered to be useful in the preparation of a water-resistant imide.

Generally, the polyimide component of the present invention can be represented by the general formula,

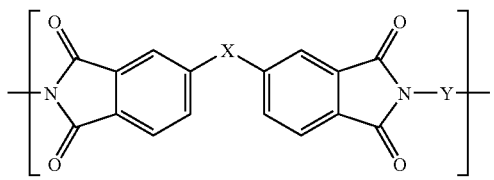

where X can be equal to $SO_2$ or $C(CF_3)_2$. $C(CF_3)_2$ $C(CF_3)$phenyl, $C(CF_3)CF_2CF_3$, $C(CF_2CF_3)$phenyl (and combinations thereof); and where Y is derived from a diamine component comprising from 2 to 50 mole percent of a phenolic-containing diamine selected from the group consisting of 2,2'-bis(3-amino-4-hydroxyphenyl) hexafluoropropane (6F-AP), 3,3'-dihydroxy-4,4'-diaminobiphenyl (HAB), 2,4-diaminophenol, 2,3-diaminophenol, 3,3'-diamino-4,4'-dihydroxy-biphenyl, and 2,2'-bis(3-amino-4-hydroxyphenyl) hexafluoropropane.

Diamines useful in comprising the remaining portion of the diamine component (i.e., that portion comprising from about 50 to 98 mole percent of the total diamine component) can be 3,4'-diaminodiphenyl ether (3,4'-ODA), 4,4'-diamino-2,2'-bis(trifluoromethyl)biphenyl (TFMB), 3,3',5,5'-tetramethylbenzidine, 2,3,5,6-tetramethyl-1,4-phenylenediamine, 3,3'-diaminodiphenyl sulfone, 3,3'dimethylbenzidine, 3,3'-bis(trifluoromethyl)benzidine, 2,2'-bis-(p-aminophenyl) hexafluoropropane, bis(trifluoromethoxy)benzidine (TFMOB), 2,2'-bis(pentafluoroethoxy)benzidine (TFEOB), 2,2'-trifluoromethyl-4,4'-oxydianiline (OBABTF), 2-phenyl-2-trifluoromethyl-bis(p-aminophenyl)methane, 2-phenyl-2-trifluoromethyl-bis(m-aminophenyl)methane, 2,2'-bis(2-heptafluoroisopropoxy-tetrafluoroethoxy)benzidine (DFPOB), 2,2-bis(m-aminophenyl)hexafluoropropane (6-FmDA), 2,2-bis(3-amino-4-methylphenyl)hexafluoropropane, 3,6-bis(trifluoromethyl)-1,4-diaminobenzene (2TFMPDA), 1-(3,5-diaminophenyl)-2,2-bis(trifluoromethyl)-3,3,4,4,5,5,5-heptafluoropentane, 3,5-diaminobenzotrifluoride (3,5-DABTF), 3,5-diamino-5-(pentafluoroethyl)benzene, 3,5-diamino-5-(heptafluoropropyl)benzene, 2,2'-dimethylbenzidine (DMBZ), 2,2',6,6'-tetramethylbenzidine (TMBZ), 3,6-diamino-9,9-bis(trifluoromethyl)xanthene (6FCDAM), 3,6-diamino-9-trifluoromethyl-9-phenylxanthene (3FCDAM), 3,6-diamino-9,9-diphenyl xanthene. These diamines can be used alone or in combination with one another.

Generally speaking, the present inventors found that if less than about 2 mole percent (of the total diamine component) comprises phenolic containing diamines, the polyimide formed may not be capable of sufficiently crosslinking with the epoxy component. In addition, if more than about 50 mole percent of the diamine component is a phenolic containing diamine, the polyimide may be highly susceptible to unwanted water absorption. As such, the diamine component of the present invention can typically comprises from about 2 to about 50 mole percent of a phenolic-containing diamine to be effective.

The polyimides of the invention are prepared by reacting a suitable dianhydride (or mixture of suitable dianhydrides, or the corresponding diacid-diester, diacid halide ester, or tetracarboxylic acid thereof) with one or more selected diamines. The mole ratio of dianhydride component to diamine component is preferably from between 0.9 to 1.1. Preferably, a slight molar excess of dianhydrides can be used at mole ratio of about 1.01 to 1.02. End capping agents, such as phthalic anhydride, can be added to control chain length of the polyimide.

Some dianhydrides found to be useful in the practice of the present invention, i.e., to prepare the polyimide component, can be 3,3',4,4'-diphenylsulfone tetracarboxylic dianhydride (DSDA), 2,2-bis(3,4-dicarboxyphenyl)1,1,1,3,3,3-hexafluoropropane dianhydride (6-FDA), 1-phenyl-1,1-bis(3,4-dicarboxyphenyl)-2,2,2-trifluoroethane dianhydride, 1,1,1,3,3,4,4,4-octylfluoro-2,2-bis(3,4-dicarboxyphenyl)butane dianhydride, 1-phenyl-2,2,3,3,3-pentafluoro-1,1-bis(3,4-dicarboxylphenyl)propane dianhydride, 4,4'-oxydiphthalic anhydride (ODPA), 2,2'-bis(3,4-dicarboxyphenyl)propane dianhydride, 2,2'-bis(3,4-dicarboxyphenyl)-2-phenylethane dianhydride, 2,3,6,7-tetracarboxy-9-trifluoromethyl-9-phenylxanthene dianhydride (3FCDA), 2,3,6,7-tetracarboxy-9,9-bis(trifluoromethyl)xanthene dianhydride (6FCDA), 2,3,6,7-tetracarboxy-9-methyl-9-trifluoromethylxanthene dianhydride (MTXDA), 2,3,6,7-tetracarboxy-9-phenyl-9-methylxanthene dianhydride (MPXDA), 2,3,6,7-tetracarboxy-9,9-dimethylxanthene dianhydride (NMXDA) and combinations thereof. These dianhydrides can be used alone or in combination with one another.

The present invention also comprises certain sterically hindered hydrophobic epoxies to make up the polyimide/epoxy component. While many epoxies are known to be hydrophobic, the present inventors found that only some of these epoxies provide good water resistance of cured, embedded resistors with accelerated aging testing at 85° C. and 85% RH. As used herein, these epoxies can be described as being 'sterically hindered'. As used herein, 'sterically hindered' means a polymer having a molecular structure whereby it is difficult for water (or a water molecule) to chemically associate with the backbone polymer.

Generally, some epoxies found to be useful in the practice of the present invention can be represented by the formula below,

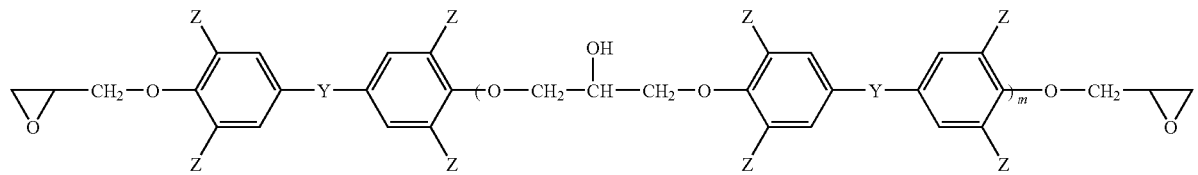

where z is an alkyl, alkoxy, phenyl, phenoxy, halogen, or combinations thereof; where Y is a covalent bond, oxygen, sulfur, methylene, fluorenylidene, ethylidene, sulfonyl, cyclohexylidene, 1-phenylethylidene, $C(CH_3)_2$, or $C(CF_3)_2$; and where m is an integer between, and including, 0 and 5. In one embodiment of the present invention, the epoxy component can be tetramethyl biphenol epoxy (TMBP), tetramethylbisphenol A (TMBPA), tetrabromobisphenol-A, or combinations of these. In one embodiment of the present invention an amount of epoxy component found to be useful, in relationship to the amount of polyimide component can be expressed by the following ratio A:B where A is the polyimide component and B is the epoxy component, and where A is between, and including, any two of the following numbers 1, 2, 3, 4, 5, 10, 12 and 15, and where B is 1.0

In the practice of the present invention an organic solvent is selected that can easily dissolve the polyimide component and which can be boiled off (later in processing) at a relatively low operating temperature. The polyimide component can typically be in the 'polyimide state' (i.e., as opposed to the polymer being in the polyamic acid, or other polyimide precursor state). As such, a lower processing temperature can be achieved (in order to dry the composition of solvent) provided that certain solvents disclosed herein are chosen to allow the polyimide/epoxy-based pastes of the present invention to possess sufficient resistance to moisture sorption, particularly during a screen-printing process.

Solvents known to be useful in accordance with the practice of the present invention include organic liquids having both (i.) a Hanson polar solubility parameter between and including any two of the following numbers 2.1, 2.2, 2.3, 2.4, 2.5, 2.6, 2.7, 2.8, 2.9 and 3.0, and (ii) a normal boiling point ranging from between and including any two of the following numbers 210, 220, 230, 240, 250 and 260° C. In one embodiment of the present invention, a useful solvent is selected from one or more dibasic acid ester solvents including, but not limited to, DuPont DBE® solvents including dimethyl succinate, dimethyl glutarate and dimethyl adipate. Other useful solvents include propyleneglycol diacetate (PGDA), Dowanol® PPh, butyl carbitol acetate, carbitol acetate and mixtures of these. Cosolvents may be added provided that the composition is still soluble, performance in screen-printing is not adversely affected, and lifetime storage is also not adversely affected.

Another advantage to using the solvents disclosed in the present invention is that in certain embodiments, very little, if any, precipitation of the polyimide is observed when handling a paste composition. Also, the use of a polyamic acid solution may be avoided. Instead of using a polyamic acid, which can be thermally imidized to the polyimide later during processing, an already formed polyimide is used. This allows for lower curing temperatures to be used, temperatures not necessary to convert, to near completion, a polyamic acid to a polyimide. In short, the resulting solutions can be directly incorporated into a liquid or paste composition for coating and screen-printing applications without having to cure the polyimide.

In one embodiment of the present invention an electrically conductive material can be added to the polyimide/epoxy component to make these compositions useful as an electronic-grade paste. Generally, these electrically conductive materials can be in the form of a powder. Commonly used powders can be metals or metal oxides. Other common powders include common graphite materials and carbon powders. In another embodiment of the present invention, the electrically conductive material can be a reduced oxide of a metal selected from the group consisting of Ru, Bi, Gd, Mo, Nb, Cr and Ti. The term "metal oxide" can be defined herein as a mixture of one or more metals with an element of Groups IIIA, IVA, VA, VIA or VIIA of the Periodic Table. In particular, the term metal oxides can include metal carbides, metal nitrides, and metal borides, titanium nitride and carbide, zirconium boride and carbide and tungsten boride.

In general, the amount of electrically conductive material added to a composition depends on the end use application (e.g., either the electrical conductivity or resistivity desired). In general, one amount of electrically conductive material found to be useful can range between, and including, any two of the following numbers, 10, 15, 20, 25, 30, 35, 40, 45, 50, 55, 60, 65, 70, 75 and 80 weight percent of the total dry weight of the composition. Typically ruthenium oxides, or complex metals having ruthenium in them, can be used to prepare compositions having a lower electrical resistivity. In 'higher range' electrical resistivity applications, titanium nitride and carbide, zirconium boride and carbide, and tungsten boride, can be used.

Because screen-printing is often the method of choice for PTF resistors, a paste in accordance with the present invention must generally remain stable for reasonably long exposures to ambient moisture (i.e., while the paste resides on the screen). If the polyimide/epoxy solution is not stable to moisture absorption, the polyimide component can precipitate (which is undesirable), making the paste unusable and thereby requiring considerable effort to remove the residual 'damaged paste' from the screen. Additionally, excessive water uptake can also cause the paste's viscosity to drift, thus altering the printed resistor thickness and ultimately the cured resistance.

Polyimides in general are insoluble. The few polyimides that are soluble are only soluble in select polar organic solvents. But, many polar organic solvents act like a sponge and absorb water from the ambient environment. Often, the relative humidity of an atmosphere is sufficiently high enough that water absorption into the composition is significant. The water in the composition and in the polyimide solutions can cause the polyimide to precipitate, which essentially renders the composition unusable for most purposes. The composition must be discarded, and the screen may be damaged in attempts to remove intractable paste plugging the holes in the screen.

The polyimides of the present invention can be made by thermal and chemical imidization using a different solvent as otherwise described herein. The polyimide component can be removed from the solvent by precipitation in a non-solvent such as methanol, then re-dissolved in a solvent disclosed earlier herein. Using a thermal method, the dianhydride can be added to a solution of the diamine in any of the following polar solvents, m-cresol, 2-pyrrolidone, N-methylpyrrolidone (NMP), N-ethylpyrrolidone, N-vinylpyrrolidone), N,N'-dimethyl-N,N'-propylene urea (DMPU), cyclohexylpyrrolidone (CHP), N,N-dimethylacetamide (DMAc), N,N-dimethylformamide (DMF) and γ-butyrolactone (BLO). The reaction temperature for preparation of the polyamic acid or polyamic acid ester is typically between 25° C. and 40° C. Alternatively, the dianhydrides were dissolved in one of these solvents, and the diamines were added to the dianhydride solution.

After the polyamic acid (or polyamic acid ester) is produced, the temperature of the reaction solution is then raised considerably to complete the dehydration ring closure. The temperatures used to complete the ring closure are typically from 150° C. to 200° C. A high temperature is used is to assure converting the polyamic acid into a polyimide. Optionally, a co-solvent can be used help remove the water produced during imidization (e.g., toluene, xylene and other aromatic hydrocarbons).

The chemical method includes the use of a chemical imidizing agent, which is used to catalyze the dehydration, or ring closing. Chemical imidization agents such as acetic anhydride and β-picoline can be used. The reaction solvent is not particularly limited so long as it is capable of dissolving the polyamic acid and polyimide. The resulting polyimide is then precipitated. This can be performed by adding the polyimide to a non-solvent. These non-solvents can be methanol, ethanol, or water. The solid is washed several times with the non-solvent, and the precipitate is oven dried.

Polyimides of the present invention can be made to be crosslinkable by using one or more aromatic diamines with one or more phenolic hydrogens. Some of these aromatic diamines can be 3,3'-dihydroxy-4,4'-diaminobiphenyl (HAB), and 2,2'-bis(3-amino-4-hydroxyphenyl)hexafluoropropane (6F-AP). The phenolic functionality reacts with one or more other crosslinking agent during curing. Only a small amount of cross-linking aromatic diamine is generally needed to provide an improvement in mechanical strength in the cured material. In fact, if too much of the cross-linking diamine is used, the resulting polyimide will tend to have more moisture sensitivity.

In one embodiment of the present invention, a sterically hindered phenol can be used as a cross-linking agent for the epoxy component. The phenol can be added as an additional component to the polyimide component and the epoxy component. Examples of specific sterically hindered phenols found to be useful include, but are not limited to, 3,3',5,5'-tetramethylbiphenol-4,4'-diol, 4,4'-isopropylidenebis(2,6-dimethylphenol), and 4,4'-isopropylidenebis(2,6-dibromophenol). In one embodiment of the present invention, the amount of sterically hindered phenols added to the polyimide/epoxy component is between about 0.6 to 3.0 mole percent of the amount of sterically hindered epoxy component. In another embodiment, a useful phenol can be represented by the general formula, in the composites industry including pressing, lamination, extrusion, molding, and the like. However, most thick film compositions are applied to a substrate by means of screen-printing. Therefore, they must have appropriate viscosity so that they can be passed through the screen readily. In addition, they should be thixotropic in order that they set up rapidly after being screened, thereby giving good resolution. Although the rheological properties are of importance, the organic solvent should also provide appropriate wettability of the solids and the substrate, a good drying rate, and film strength sufficient to withstand rough handling.

Curing of a final paste composition is accomplished by any number of standard curing methods including convection heating, forced air convection heating, vapor phase condensation heating, conduction heating, infrared heating, induction heating, or other techniques known to those skilled in the art. In one embodiment of the present invention, a catalyst can be used to aid in curing of a polymer matrix. Useful catalysts of the present invention include, but are not limited to, blocked or unblocked tertiary aromatic amine catalysts. Examples of these catalysts include dimethylbenzylammonium acetate and dimethylbenzylamine.

In some applications the use of a crosslinkable polyimide, or crosslinkable epoxy, in a liquid or paste composition can provide important performance advantages over the corresponding non-crosslinkable polyimide or epoxies of the invention. For example, the ability of the polyimide to crosslink with crosslinking agents during a thermal cure can provide electronic coatings with enhanced thermal and humidity resistance. The resulting cross-linked polyimide can stabilize the binder matrix, raise the Tg, increase chemical resistance, or increase thermal stability of the cured coat-

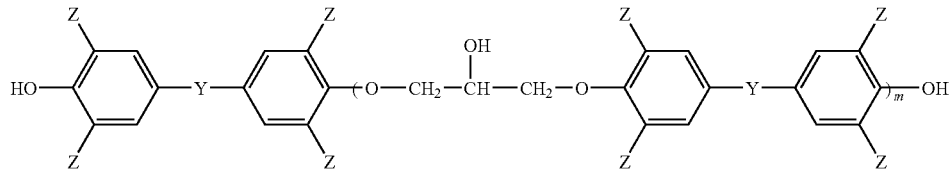

where Z is an alkyl, alkoxy, phenyl, phenoxy, halogen or combinations thereof, where Y is a covalent bond, oxygen, sulfur, methylene, fluorenylidene, ethylidene, sulfonyl, cyclohexylidene, 1-phenylethylidene, $C(CH_3)_2$, or $C(CF_3)_2$, and where m is an integer between and including 0, 1, 2, 3, 4 and 5.

Paste compositions containing the polyimides and epoxies of the invention can be used in multiple electronic applications. In one embodiment, the liquid and paste compositions of the invention will include a polyimide with a glass transition temperature greater than 250° C., preferably greater than 280° C., more preferably greater than 310° C. In one embodiment, the compositions will also comprise a polyimide with a water absorption factor of 2% or less, preferably 1.5% or less, and more preferably 1% or less. The polyimides used in the composition will also exhibit a positive solubility measurement in an organic solvent.

Most thick film compositions are applied to a substrate by screen printing, stencil printing, dispensing, doctor-blading into photoimaged or otherwise preformed patterns, or other techniques known to those skilled in the art. These compositions can also be formed by any of the other techniques used ing compositions. Compared to polyimides that contain no crosslinking functionality, slightly lower Tg of the polyimide or slightly higher moisture absorption of the polyimide can be tolerated.

In yet another embodiment of the present invention, a thermal crosslinking agent is added to the polyimide/epoxy formulation (typically a polyimide/epoxy solution) to provide additional crosslinking functionality. A highly cross-linked polymer, after a thermal curing cycle, can yield electronic coatings with enhanced thermal and humidity resistance. The effect of thermal crosslinking agent is to stabilize the binder matrix, raise the Tg of the binder composite, increase chemical resistance, and increase thermal resistance of the cured, final coating composition.

Some useful thermal crosslinkers suitable for the present invention include blocked isocyanates and polyhydroxystyrene. Blocked isocyanates can react with hydroxyls including those resulting from the epoxy-crosslinkable polyimide reaction. Polyhydroxystyrene can react with the epoxy functionality in the epoxy-containing resin.

Other preferred thermal crosslinking agents are selected from the group consisting an epoxidized copolymer of phenol and aromatic hydrocarbon, a polymer of epichlorohydrin and phenol formaldehyde, and 1,1,1-tris(p-hydroxyphenyl) ethane triglycidyl ether.

In one embodiment of the present invention, the polyimide/epoxy component can be combined with other functional fillers for form different types of electronic materials. For example, functional fillers for capacitors include, but are not limited to, barium titanate, barium strontium titanate, lead magnesium niobate, and titanium oxide. Functional fillers for encapsulants include, but are not limited to, talc, fumed silica, silica, fumed aluminum oxide, aluminum oxide, bentonite, calcium carbonate, iron oxide, titanium dioxide, mica and glass. Encapsulant compositions can be unfilled, with only the organic binder system used, which has the advantage of providing transparent coatings for better inspection of the encapsulated component. Functional fillers for thermally conductive coatings include, but are not limited to barium nitride, aluminum nitride, aluminum oxide coated aluminum nitride, silicon carbide, boron nitride, aluminum oxide, graphite, beryllium oxide, silver, copper, and diamond.

PTF materials have received wide acceptance in commercial products, notably for flexible membrane switches, touch keyboards, automotive parts and telecommunications. In one embodiment of the present invention, a resistor (or resistive element) is prepared by printing a PTF composition, or ink, onto a sheet in a pattern. Here, it can be important to have uniform resistance across the sheet (i.e., the resistance of elements on one side of the sheet should be the same as that of elements on the opposite side). Variability in the resistance can significantly reduce yield. The resistive element should be both compositionally and functionally stable. Obviously, one of the most important properties for a resistor is the stability of the resistor over time and under certain environmental stresses. The degree to which the resistance of the PTF resistor changes over time or over the lifetime of the electronic device can be critical to performance. Also, because PTF resistors are subject to lamination of inner layers in a printed circuit board, and to multiple solder exposures, thermal stability is needed. Although some change in resistance can be tolerated, generally the resistance changes need to be less than 5%.

Resistance can change because of a change in the spacing or change in volume of functional fillers, i.e., the resistor materials in the cured PTF resistor. To minimize the degree of volume change, the polyimide component and the epoxy component (i.e., the polyimide/epoxy component) should have low water absorption so the cured polyimide based material does not swell when exposed to moisture. Otherwise, the spacing of the resistor particles will change resulting in a change in resistance.

Resistors also need to have little resistance change with temperature in the range of temperatures the electronic device is likely to be subjected. The thermal coefficient of resistance must be low, generally less than 200 ppm/° C.

The compositions of the present invention can be especially suitable for providing polymer thick film (PTF) resistors. The PTF resistors made from the inventive polyimides and corresponding compositions exhibit exceptional resistor properties and are thermally stable even in relatively high moisture environments.

The liquid or paste compositions of the present invention can further include one or more metal adhesion agents. Preferred metal adhesion agents are selected from the group consisting of polyhydroxyphenylether, polybenzimidazole, polyetherimide, polyamideimide, 2-amino-5-mercaptothiophene, 5-amino-1,3,4-thiodiazole-2-thiol, benzotriazole, 5-chloro-benzotriazole, 1-chloro-benzotriazole, 1-carboxy-benzotriazole, 1-hydroxy-benzotriazole, 2-mercaptobenzoxazole, 1H-1,2,4-triazole-3-thiol, and mercaptobenzimidazole. Typically, these metal adhesion agents are dissolved in the polyimide solutions of the present invention.

In one embodiment of the present invention, the compositions can also be dissolved into a solution and used in integrated circuit chip-scale packaging and wafer-level packaging. These compositions can be used as semiconductor stress buffer, interconnect dielectric, protective overcoat (e.g., scratch protection, passivation, etch mask, etc.), bond pad redistribution, an alignment layer for a liquid crystal display, and solder bump under fills.

The advantages of the materials present invention are illustrated in the following EXAMPLES. Processing and test procedures used in preparation of, and testing, of the polyimides of the present invention (and compositions containing these polyimides) are described below.

3 Roll Milling

A three-roll mill is used for grinding pastes to fineness of grind (FOG) generally <5μ. The gap is adjusted to 1 mil before beginning. Pastes are typically roll-milled for three passes at 0, 50, 100, 150, 200, 250 psi until FOG is <5μ. Fineness of grind is a measurement of paste particle size. A small sample of the paste is placed at the top (25μ mark) of the grind gauge. Paste is pushed down the length of the grind gauge with a metal squeegee. FOG is reported as x/y, where x is the particle size (microns) where four or more continuous streaks begin on the grind gauge, and y is the average particle size (micron) of the paste.

Screen-Printing

A 230 or 280 mesh screen and a 70-durometer squeegee are used for screen-printing. Printer is set up so that snap-off distance between screen and the surface of the substrate is typically 35 mils for an 8 in×10 in screen. The downstop (mechanical limit to squeegee travel up and down) is preset to 5 mil. Squeegee speed used is typically 1 in/second, and a print-print mode (two swipes of the squeegee, one forward and one backward) is used. A minimum of 20 specimens (per paste) was printed. After all the substrates for a paste are printed, they are left undisturbed for a minimum of 10 minutes (so that air bubbles can dissipate), then cured 1 hr at 170° C. in a forced draft oven.

Solder Float

Samples are solder floated in 60/40 tin/lead solder for 3 times for 10 seconds each, with a minimum of 3 minutes between solder exposures where the samples are cooled close to room temperature.

85° C./85% RH Testing

A minimum of three specimens that have not been cover coated are placed in an 85° C./85% RH chamber and aged for 125, 250, 375 and 500 hr at 85/85. After exposure time is reached, samples are removed from the chamber, oxidation is removed from the copper leads with a wire brush and the resistance promptly determined.

Thermal Cycling

Samples of cured resistors that have not been cover coated are subjected to thermal cycling from −25° C. to +125° C. for 150 to 200 cycles with heating and cooling rates of 10° C./min with samples held at the extreme temperatures for 30 min.

ESD

Samples of cured resistor are exposed to 5,000 instantaneous volts of electricity five times. Voltage is decreased to 2,000 volts and the sample is exposed to 10 repetitions. The resistance change (as a resistor) is measured.

TCR

TCR (thermal coefficient of resistance) is measured and reported in ppm/° C. for both hot TCR (HTCR) at 125° C. and cold TCR (CTCR) at −40° C. A minimum of 3 specimens for each sample, each containing 8 resistors, is used. The automated TCR averages the results.

Thermal Conductivity Measurement

A film ~0.3 mm is prepared on releasing paper by solution cast, followed by drying at 170° C. for 1 hour. A 1" diameter puncher is used to cut the sample into the right size. For the thermal conductivity determination a laser flash method is used to determine the thermal conductivity. Samples are sputtered with ~200 Å of Au layer in order to block the laser flash being seen by the IR detector during the measurement. The gold coating is then sprayed with three coats of micronically fine synthetic graphite dispersion in Fluron®. The graphite coating increases the absorption of radiation on the laser side of the sample, and increases the emission of radiation on the detector side.

The specific heat is determined first by comparing with that of a standard (Pyrex® 7740), and then corrected by subtracting those of gold and graphite coatings. The bulk density is calculated based on the formulation. Thermal diffusivity in the unit of cm/s is obtained via a Netzsh laser flash instrument. The thermal conductivity is calculated as:

Conductivity=(Diffusivity×Density×Specific Heat)

Temperature is controlled at 25° C. via a Neslab circulating batch. Scan time is set at 200 ms with an amperage gain of 660 for Pyrexe® standard and 130-200 second and 600 gain for the sample. A Nd:glass laser of 1060 nm and pulse energy of 15 J and pulse width of 0.33 ms is used. Three laser shots are taken for each sample.

Stability of Polyimide Solutions in the Presence of Water Vapor 0.4 to 0.5 grams of 10% solids solutions of the polyimide are placed in a 1 inch diameter watch glass and placed in a 130 mm diameter desiccator that contains an aqueous saturated solution of ammonium sulfate which gives 75% to 85% RH in the closed container. The samples are observed and the time where the sample becomes cloudy or opaque or when a ring of precipitated polymer is recorded. The polyimide sometimes precipitates on the outside edge first where the solution depth is the least, and with time precipitation occurs across the entire sample. Polyimide solutions that resist precipitation for the longest time will yield paste compositions with the longest self-life stability to high humidity conditions. Solutions of polyimide that do not precipitate in 8 hours exposure are said to have a positive solubility measurement. A hygrometer from Extech Instruments is placed in the desiccator to monitor the % RH.

Polyimide Film Moisture Absorption Test

The ASTM D570 method is used where polyimide solution is coated with a 20-mil doctor knife on a glass plate. The wet coating is dried at 190° C. for about 1 hour in a forced draft oven to yield a polyimide film of 2 mils thickness. In order to obtain a thickness of greater than 5 mils as specified by the test method, two more layers are coated on top of the dried polyimide film with a 30 min 190° C. drying in a forced draft oven between the second and third coating. The three layer coating is dried 1 hr at 190° C. in a forced draft oven and then is dried in a 190° C. vacuum oven with a nitrogen purge for 16 hrs or until a constant weight is obtained. The polyimide film is removed from the glass plate and cut into one inch by 3-inch strips. The strips are weighed and immersed in deionized water for 24 hrs. Samples are blotted dry and weighed to determine the weight gain so that the percent water absorption can be calculated.

EXAMPLE 1

A polyimide was prepared by conversion of a polyamic acid to polyimide with chemical imidization. To a dry three neck round bottom flask equipped with nitrogen inlet, mechanical stirrer and condenser was added 800.45 grams of DMAC, 89.98 grams of 3,3'-bis-(trifluoromethyl)benzidine (TFMB), 3.196 grams 3,3'-dihydroxy-4,4'-diaminobiphenyl (HAB) and 0.878 grams of phthalic anhydride (to control molecular weight).

To this stirred solution was added over one hour 104.87 grams of 3,3',4,4'-diphenylsulfone tetracarboxylic dianhydride (DSDA). The solution of polyamic acid reached a temperature of 33° C. and was stirred without heating for 16 hrs. 119.56 grams of acetic anhydride were added followed by 109.07 grams of 3-picoline and the solution was heated to 80° C. for 1 hour.

The solution was cooled to room temperature, and the solution added to an excess of methanol in a blender to precipitate the product polyimide. The solid was collected by filtration and was washed 2 times by re-blending the solid in methanol. The product was dried in a vacuum oven with a nitrogen purge at 150° C. for 16 hrs to yield 188.9 grams of product having a number average molecular weight of 46,300 and a weight average molecular weight of 93,900. The molecular weight of the polyimide polymer was obtained by size exclusion chromatography using polystyrene standards. The polyimide was dissolved at 20% solids in a 60/40 weight/weight mixture of propyleneglycol diacetate (PGDA)/Dowanol® PPh.

EXAMPLE 2

EXAMPLE 2 illustrates the use of a high Tg crosslinkable polyimide used in a PTF resistor composition that contains hydrophobic thermal crosslinkers. A PTF resistor paste composition was prepared using the polyimide solution of EXAMPLE 1. This was performed by adding, to the polyimide solution, the additional components listed below, including but not limited to, a hydrophobic epoxy and electrically conductive materials.

The PTF resistor paste included one or more metal powders (or metal oxides), hydrophobic thermal crosslinkers, and an aromatic amine catalyst. The PTF resistor paste composition was prepared by mixing the following ingredients in an ambient environment with stirring to give a crude paste mixture.

| Ingredient | % by weight |
| --- | --- |
| Ruthenium dioxide powder | 28.13 |
| Bismuth ruthenate powder | 16.25 |
| Graphite | 1.52 |
| Alumina powder | 10.13 |
| Polyimide solution | 38.50 |
| Tetramethylbisphenol A | 0.98 |
| RSS-1407 (epoxy) | 1.48 |
| Desmodur ® BL4265A solution | 1.03 |
| Dimethylbenzylamine | 0.06 |
| Borchi KAT 22 | 0.08 |
| 2-MB | 0.03 |
| 60/40 mixture of PGDA/Dowanol ® PPh | 1.81 |

The paste composition was 67 percent by weight solids.

EXAMPLE 3

The PTF resistor paste of EXAMPLE 2 was used to prepare a PTF resistor. The PTF resistor paste was printed directly onto chemically cleaned copper without a silver immersion process. Silver immersion processes are typically used to pre-treat a copper surface.

The PTF resistor paste was 3-roll milled with a 1 mil gap with 3 passes each set at 0, 50, 100, 200, 250 and 300 psi pressure to yield a fineness of grind of 7/3. The paste was screen-printed using a 280-mesh screen, an 80-durometer squeegee, on print-print mode, at 10-psi squeegee pressure, on chemically cleaned FR-4 substrates, and with a 40 and 60 mil resistor pattern.

The samples were baked in a forced draft oven at 170° C. for 1 hr followed by 2 min at 230° C. cure in air. The properties of the resulting cured PTF resistor were recorded as follows:

| Resistance (ohm/square) | 129 |
| --- | --- |
| Thickness (microns) | 15 |
| HTCR (ppm/° C.) | 190 |
| CTCR (ppm/° C.) | −105 |
| % resistance change of 40 mil resistors after: | |
| Brown oxide | −0.48 |
| Lamination | 0.6 |
| 96 hrs at 85° C./85% RH | 4.9 |
| Thermal cycling (−25° C. to 125° C.) | −13.4 |
| ESD (10 pulses at 2,000 v) | −0.12 |

EXAMPLE 4

A polyimide was prepared by conversion of a polyamic acid to polyimide with chemical imidization. To a dry three neck round bottom flask equipped with nitrogen inlet, mechanical stirrer and condenser was added 800.23 grams of DMAC, 70.31 grams of 3,3'-bis-(trifluoromethyl)benzidine (TFMB), 14.18 grams 2,2'-bis(3-amino-4-hydroxyphenyl) hexafluoropropane (6F-AP) and 0.767 grams of phthalic anhydride.

To this stirred solution was added over one hour 113.59 grams of 2,2'-bis-3,4-dicarboxyphenyl)hexafluoropropane dianhydride (6-FDA). The solution of polyamic acid reached a temperature of 32° C. and was stirred without heating for 16 hrs. To 104.42 grams of acetic anhydride were added followed by 95.26 grams of 3-picoline and the solution was heated to 80° C. for 1 hour.

The solution was cooled to room temperature, and the solution added to an excess of methanol in a blender to precipitate the product polyimide. The solid was collected by filtration and was washed 2 times by re-blending the solid in methanol. The product was dried in a vacuum oven with a nitrogen purge at 150° C. for 16 hrs to yield 165.6 grams of product having a number average molecular weight of 54,600 and a weight average molecular weight of 151,400. The polyimide was dissolved at 20% solids in butyl carbitol acetate.

EXAMPLE 5

This example was prepared to illustrate the use of a hydrophobic thermal crosslinker (RSS-1407) and a catalyst (dimethylbenzylamine) in a crosslinkable polyimide composition in accordance with EXAMPLE 4. This was performed by adding, to the polyimide solution, the additional components listed below.

The PTF resistor paste included one or more metal powders (or metal oxides), hydrophobic thermal crosslinkers, and an aromatic amine catalyst. The PTF resistor paste composition was prepared by mixing the following ingredients in an ambient environment with stirring to give a crude paste mixture.

| Ingredient | % by weight |
| --- | --- |
| Ruthenium dioxide powder | 22.26 |
| Bismuth ruthenate powder | 11.66 |
| raphite | 1.47 |
| Alumina powder | 14.45 |
| Polyimide solution | 36.58 |
| Tetramethylbisphenol A | 0.64 |
| RSS-1407 | 1.42 |
| Desmodur ® BL4265A solution | 0.99 |
| Dimethylbenzylamine | 0.06 |
| Borchi KAT 22 | 0.08 |
| 2-MB | 0.01 |
| butyl carbitol acetate | 10.37 |

The paste composition was 62.9 percent by weight solids.

EXAMPLE 6

The PTF resistor paste of EXAMPLE 5 was used to prepare the PTF resistor of EXAMPLE 6. The PTF resistor paste was printed directly onto chemically cleaned copper without a silver immersion process. Silver immersion processes are typically used to pre-treat a copper surface.

The PTF resistor paste was 3-roll milled with a 1 mil gap with 3 passes each set at 0, 50, 100, 200, 250 and 300 psi pressure to yield a fineness of grind of 7/2. The paste was screen-printed using a 180-mesh screen, an 80-durometer squeegee, on print-print mode, at 10-psi squeegee pressure, on chemically cleaned FR-4 substrates, and with a 40 and 60 mil resistor pattern.

The samples were baked in a forced draft oven at 170° C. for 1 hr followed by 2 min at 230° C. cure in air. The properties of the resulting cured PTF resistor were recorded as follows:

| Resistance (ohm/square) | 98.2 |
| --- | --- |
| Thickness (microns) | 15 |
| % resistance change of 40 mil resistors after: | |
| Lamination | −0.76 |
| 96 hrs at 85° C./85% RH | 3.2 |
| Thermal cycling (−25° C. to 125° C., 50 cycles) | −15.9 |

EXAMPLE 7

A PTF resistor paste composition was prepared using the polyimide solution of EXAMPLE 1. This was performed by adding, to the polyimide solution, the additional components listed below.

The PTF resistor paste included one or more metal powders (or metal oxides), hydrophobic thermal crosslinkers, and a blocked aromatic amine catalyst, dimethylbenzylammonium acetate. The PTF resistor paste composition was prepared by mixing the following ingredients in an ambient environment with stirring to give a crude paste mixture.

| Ingredient | % by weight |
| --- | --- |
| Ruthenium dioxide powder | 29.81 |
| Bismuth ruthenate powder | 21.59 |
| Silver powder | 6.94 |
| Alumina powder | 6.18 |
| Polyimide solution | 21.30 |
| Tetramethylbisphenol A | 2.08 |
| RSS-1407 | 3.13 |
| Phenoxy resin PKHH 23.89% solids | 3.31 |
| Dimethylbenzylammonium acetate | 0.07 |
| Dibutyltin dilaurate | 0.08 |
| 2-MB | 0.03 |
| 80/20 weight/weight PGDA/Dowanol ® PPh | 5.48 |

The paste composition was 74.2 percent by weight solids.

EXAMPLE 8

The PTF resistor paste of EXAMPLE 8 was used to prepare the PTF resistor of EXAMPLE 7. The PTF resistor paste was printed directly onto chemically cleaned copper without a silver immersion process. Silver immersion processes are typically used to pre-treat a copper surface.

The PTF resistor paste was 3-roll milled with a 1 mil gap with 3 passes each set at 0, 50, 100, 200, 250 and 300 psi pressure to yield a fineness of grind of 4/2. The paste was screen-printed using a 180-mesh screen, an 80-durometer squeegee, on print-print mode, at 10-psi squeegee pressure, on chemically cleaned FR-4 substrates, and with a 40 and 60 mil resistor pattern.

The samples were baked in a forced draft oven at 170° C. for 1 hr followed by 2 min at 230° C. cure in air. The properties of the resulting cured PTF resistor were recorded as follows:

| | |
| --- | --- |
| Resistance (ohm/square) | 45 |
| Thickness (microns) | 22.8 |
| % resistance change of 40 mil resistors after: | |
| Brown oxide | −1.9 |
| Lamination | −4.7 |
| 100 hrs at 85° C./85% RH | 5.8 |
| Thermal cycling (−25° C. to 125° C.) | −8.6 |

EXAMPLES 9A and 9B

A non-gelling binder (a polyimide component and an epoxy component with other additives) was prepared to show good long-term stability to heat (at 40° C.). This composition contained a dimethylbenzylamine catalyst and dimethylbenzylammonium acetate blocked catalyst. A polyimide was prepared in accordance with EXAMPLE 1 and dissolved 80/20 weight/weight PGDA/Dowanol® PPh. The following ingredients were combined:

| | Weight % Examples | |
| --- | --- | --- |
| Ingredients | 9A | 9B |
| Polyimide solution | 77.84 | 77.91 |
| Tetramethylbisphenol A | 4.50 | 4.50 |
| RSS-1407 (epoxy) | 6.68 | 6.69 |
| Phenoxy resin PKHH 23.89% solids | 9.55 | 9.55 |
| Dibutyltin dilaurate | 0.23 | 0.23 |
| 2-MB (10% solids in NMP) | 0.93 | 0.93 |
| Dimethylbenzylammonium acetate | 0.27 | 0.00 |
| Dimethylbenzylamine | 0.00 | 0.19 |

The two solutions were heated in a sand bath set at 40° C. for 68 days. The solutions did not gel with no apparent change in viscosity. These results indicate excellent stability of the binder vehicles EXAMPLES 9A and 9B.

EXAMPLE 10

A polyimide was prepared by conversion of a polyamic acid to polyimide with chemical imidization. To a dry three neck round bottom flask equipped with nitrogen inlet, mechanical stirrer and condenser was added 800.23 grams of DMAC, 65.98 grams of 3,3'-bis-(trifluoromethyl)benzidine (TFMB), 18.86 grams 2,2'-bis(3-amino-4-hydroxyphenyl)hexafluoropropane (6F-AP) and 0.764 grams of phthalic anhydride.

To this stirred solution was added over one hour 113.26 grams of 2,2'-bis-3,4-dicarboxyphenyl)hexafluoropropane dianhydride (6-FDA). The solution of polyamic acid reached a temperature of 32° C. and was stirred without heating for 16 hrs. To 67.68 grams of acetic anhydride were added followed by 61.73 grams of 3-picoline and the solution was heated to 80° C. for 1 hour.

The solution was cooled to room temperature, and the solution added to an excess of methanol in a blender to precipitate the product polyimide. The solid was collected by filtration and was washed 2 times by re-blending the solid in methanol. The product was dried in a vacuum oven with a nitrogen purge at 150° C. for 16 hrs to yield 187.6 grams of product having a number average molecular weight of 44,300 and a weight average molecular weight of 136,300. The polyimide was dissolved at 20% solids in butyl carbitol acetate.

A PTF resistor paste composition was prepared by adding, to the polyimide solution, the additional components listed below.

The PTF resistor paste included one or more metal powders (or metal oxides), hydrophobic thermal crosslinkers, and an aromatic amine catalyst. The PTF resistor paste composition was prepared by mixing the following ingredients in an ambient environment with stirring to give a crude paste mixture.

| Ingredient | % by weight |
| --- | --- |
| Ruthenium dioxide powder | 22.4 |
| Bismuth ruthenate powder | 11.8 |
| Graphite | 1.5 |
| Alumina powder | 13.8 |
| Polyimide | 9.8 |
| RSS-1407 | 1.0 |
| Dimethylbenzylamine | 0.17 |
| butyl carbitol acetate | 39.53 |

EXAMPLE 11

The PTF resistor paste of EXAMPLE 10 was used to prepare the PTF resistor of EXAMPLE 11. The PTF resistor paste was printed directly onto chemically cleaned copper without a silver immersion process. Silver immersion processes are typically used to pre-treat a copper surface.

The PTF resistor paste was 3-roll milled with a 1 mil gap with 3 passes each set at 0, 50, 100, 200, 250 and 300 psi pressure to yield a fineness of grind of 7/2. The paste was screen-printed using a 180-mesh screen, an 80-durometer squeegee, on print-print mode, at 10-psi squeegee pressure, on chemically cleaned FR-4 substrates, and with a 40 and 60 mil resistor pattern.

The samples were baked in a forced draft oven at 170° C. for 1 hr followed by 2 min at 230° C. cure in air. The properties of the resulting cured PTF resistor were recorded as follows:

| | |
|---|---|
| Resistance (ohm/square) | 318 |
| % resistance change of 40 mil resistors after: | |
| Lamination | 1.3 |
| 120 hrs at 85° C./85% RH | 1.1 |
| Thermal cycling (−25° C. to 125° C., 60 cycles) | −5.8 |

EXAMPLE 12

A PTF resistor paste composition was prepared using the polyimide solution of EXAMPLE 10. This was performed by adding, to the polyimide solution, the additional components listed below.

The PTF resistor paste included one or more metal powders (or metal oxides), hydrophobic thermal crosslinkers, and an aromatic amine catalyst. The PTF resistor paste composition was prepared by mixing the following ingredients in an ambient environment with stirring to give a crude paste mixture.

| Ingredient | % by weight |
|---|---|
| Ruthenium dioxide powder | 22.4 |
| Bismuth ruthenate powder | 11.8 |
| Graphite | 1.5 |
| Alumina powder | 13.8 |
| Polyimide | 9.8 |
| Tetramethylbisphenol-A diglycidyl ether | 1.1 |
| Dimethylbenzylamine | 0.17 |
| butyl carbitol acetate | 39.43 |

EXAMPLE 13

The PTF resistor paste of EXAMPLE 12 was used to prepare the PTF resistor of EXAMPLE 13. The PTF resistor paste was printed directly onto chemically cleaned copper without a silver immersion process. Silver immersion processes are typically used to pre-treat a copper surface.

The PTF resistor paste was 3-roll milled with a 1 mil gap with 3 passes each set at 0, 50, 100, 200, 250 and 300 psi pressure to yield a fineness of grind of 7/2. The paste was screen-printed using a 180-mesh screen, an 80-durometer squeegee, on print-print mode, at 10-psi squeegee pressure, on chemically cleaned FR-4 substrates, and with a 40 and 60 mil resistor pattern.

The samples were baked in a forced draft oven at 170° C. for 1 hr followed by 2 min at 230° C. cure in air. The properties of the resulting cured PTF resistor were recorded as follows:

| | |
|---|---|
| Resistance (ohm/square) | 289 |
| % resistance change of 40 mil resistors after | |
| Lamination | 3.1 |
| 120 hrs at 85° C./85% RH | 3.4 |
| Thermal cycling (−25° C. to 125° C., 60 cycles) | −8.9 |

EXAMPLE 14

A PTF resistor paste composition was prepared using the polyimide solution of EXAMPLE 10. This was performed by adding, to the polyimide solution, the additional components listed below.

The PTF resistor paste included one or more metal powders (or metal oxides), hydrophobic thermal crosslinkers, and an aromatic amine catalyst. The PTF resistor paste composition was prepared by mixing the following ingredients in an ambient environment with stirring to give a crude paste mixture.

| Ingredient | % by weight |
|---|---|
| Ruthenium dioxide powder | 25.0 |
| Bismuth ruthenate powder | 13.1 |
| Graphite | 1.6 |
| Alumina powder | 15.4 |
| Polyimide | 8.2 |
| Tetrabromobisphenol-A diglycidylether | 3.9 |
| Dimethylbenzylamine | 0.14 |
| butyl carbitol acetate | 32.66 |

EXAMPLE 15

The PTF resistor paste of EXAMPLE 14 was used to prepare the PTF resistor of EXAMPLE 15. The PTF resistor paste was printed directly onto chemically cleaned copper without a silver immersion process. Silver immersion processes are typically used to pre-treat a copper surface.

The PTF resistor paste was 3-roll milled with a 1 mil gap with 3 passes each set at 0, 50, 100, 200, 250 and 300 psi pressure to yield a fineness of grind of 7/2. The paste was screen-printed using a 180-mesh screen, an 80-durometer squeegee, on print-print mode, at 10-psi squeegee pressure, on chemically cleaned FR-4 substrates, and with a 40 and 60 mil resistor pattern.

The samples were baked in a forced draft oven at 170° C. for 1 hr followed by 2 min at 230° C. cure in air. The properties of the resulting cured PTF resistor were recorded as follows:

| | |
|---|---|
| Resistance (ohm/square) | 96.0 |
| % resistance change of 40 mil resistors after: | |
| Lamination | 1.0 |
| 120 hrs at 85° C./85% RH | 3.2 |
| Thermal cycling (−25° C. to 125° C., 60 cycles) | −6.9 |

EXAMPLE 16

A PTF capacitor paste was prepared using the polyimide solution of Example 10. This was performed by adding, to the polyimide solution, the additional components listed below.

The PTF capacitor paste included one or more, hydrophobic thermal crosslinkers, and an aromatic amine catalyst. The PTF capacitor paste composition was prepared by mixing the following ingredients in an ambient environment with stirring to give a crude paste mixture.

| Ingredient | % by weight |
|---|---|
| Polyimide | 9.16 |
| RSS-1407 | 0.95 |
| Dimethylbenzylamine | 0.16 |
| Barium titanate | 53.11 |
| butyl carbitol acetate | 36.62 |

EXAMPLE 17

The PTF capacitor paste of EXAMPLE 16 was used to prepare the PTF capacitor of EXAMPLE 17. The PTF capacitor paste was printed directly onto chemically cleaned copper without a silver immersion process. Silver immersion processes are typically used to pre-treat a copper surface.

The PTF capacitor paste was 3-roll milled with a 1 mil gap with 3 passes each set at 0, 50, 100, 200, 250 and 300 psi pressure to yield a fineness of grind of 5/2. The paste was screen-printed using a 180-mesh screen, an 80-durometer squeegee, on print-print mode, at 10-psi squeegee pressure, on chemically cleaned FR-4 substrates, and with a 40 and 60 mil resistor pattern.

The samples were baked in a forced draft oven at 170° C. for 1 hr followed by 2 min at 230° C. cure in air. A polymer thick film conductor was then printed over the capacitors and cured at 150° C. for 30 minutes to form the top electrode. The average properties of the resulting cured PTF capacitors were recorded as follows:

| | |
|---|---|
| capacitance | 1 nf |
| Thickness (microns) | 16 microns |
| Dielectric constant (calculated) | 38 |
| % capacitance change of after: | |
| Lamination | 4.8% |
| 120 hrs at 85° C./85% RH | 5.1% |
| Thermal cycling (−25° C. to 125° C., 60 cycles) | 1.4% |

EXAMPLE 18

A PTF conductor paste was prepared using the polyimide solution of Example 10. This was performed by adding, to the polyimide solution, the additional components listed below.

The PTF conductor paste included one or more, hydrophobic thermal crosslinkers, and an aromatic amine catalyst. The PTF conductor paste composition was prepared by mixing the following ingredients in an ambient environment with stirring to give a crude paste mixture.

| Ingredient | % by weight |
|---|---|
| Polyimide | 8.87 |
| RSS-1407 | 0.92 |
| Dimethylbenzylamine | 1.51 |
| Silver powder | 53.22 |
| butyl carbitol acetate | 35.48 |

EXAMPLE 19

The PTF conductor paste of EXAMPLE 18 was used to prepare the PTF conductor of EXAMPLE 19. The PTF conductor paste was printed directly onto FR-4 and Kapton®. The PTF conductor paste was 3-roll milled with a 1 mil gap with 3 passes each set at 0, 50, 100, 200, 250 and 300 psi pressure to yield a fineness of grind of 3/2. The paste was screen-printed using a −200 mesh screen, an 80-durometer squeegee, on print-print mode, at 10-psi squeegee pressure, on FR-4 and Kapton® film.

The samples were baked in a forced draft oven at 170° C. for 1 hr followed by 2 min at 230° C. cure in air. The properties of the resulting cured PTF resistor were recorded as follows:

| | |
|---|---|
| Resistance: | 20 milli-ohm/square at 1 mil thickness |
| Thickness (microns): | 18 microns |

COMPARATIVE EXAMPLE 1

COMPARATIVE EXAMPLE 1 exhibited a significant % change in resistance (which is undesirable) upon lamination when the sample was exposed to high heat and humidity.

A polyimide solution, where the polyimide is derived from DSDA dianhydride and a combination of TFMB and HAB diamine (at a ratio of 0.95:0.5 respectively), was prepared using gamma-butyrolactone (GV) as the solvent.

To a dry, three-neck round bottom flask equipped with nitrogen inlet, mechanical stirrer, Dean Stark trap, and condenser was added 85.0 grams of gamma-butyrolactone solvent (GV), 8.933 grams of 2,2'-Bis(trifluoromethyl)benzidine (TFMB) and 0.313 grams 3,3'-dihydroxy-4,4'-diaminobiphenyl (HAB).

After one hour of stirring the solution at room temperature, 10.61 grams of 3,3',4,4'-diphenylsulfone tetracarboxylic dianhydride (DSDA) were added to form a polyamic acid solution. The polyamic acid solution reached a temperature of 29° C. The solution was stirred without heating for 15 hrs.

16.38 grams of toluene were added to the Dean Stark trap. 17.25 grams of toluene were added to the polyamic acid solution. The solution was then heated in an oil bath, set at 180° C., to convert the polyamic acid to a polyimide.

After no more product water was collected in the trap (the water formed during an imidization reaction), the toluene was distilled off. This allowed the reaction temperature to rise to between 165° C. and 170° C. The polyimide solution was stirred in this temperature range for four hours.

The polyimide solution was cooled to room temperature to yield 90 grams of 19.9% polyimide solids dissolved in gamma-valerolactone (GV) solvent. The polyimide solution had a viscosity of 116 Pa×sec.

The molecular weight of the polyimide polymer was obtained by size exclusion chromatography using polystyrene standards. The number average molecular weight of the polyimide was 61,300. The weight-average molecular weight was 255,300.

The glass transition temperature (Tg) of the polyimide was measured to be 330° C. The percent moisture absorption factor (using test ASTM D570) of a 6-mil thick polyimide film made from this polymer was 1.5%.

A PTF resistor paste composition was prepared by adding the additional components listed below to the polyimide solution. The PTF resistor paste included one or more metal powders, additional thermal crosslinkers, and an adhesion-promoting phenoxy resin.

The resistor paste composition was prepared by mixing the following ingredients in an ambient environment with stirring to give a crude paste mixture.

| Ingredient | % by weight |
| --- | --- |
| Ruthenium dioxide powder | 25.73 |
| Bismuth ruthenate powder | 18.65 |
| Silver powder | 5.98 |
| Alumina powder | 5.32 |
| Polyimide solution | 39.08 |
| Phenoxy resin PKHH solution | 2.83 |
| Epon ® 828 | 0.75 |
| Desmodur ® BL3175A solution | 1.35 |
| 2-ethyl-4-methylimidazole | 0.05 |
| 2-MB | 0.26 |

4.38 grams of BLO solvent was then added to facilitate mixing of the paste composition to yield a 54.9 percent by weight solids paste mixture. The resistor paste composition was used to prepare the resistor composition. The resistor paste was printed directly on chemically cleaned copper without the silver immersion process. Silver immersion processes are typically used to pre-treat a copper surface.

The paste was 3-roll milled with a 1 mil gap with 3 passes each set at 0, 50, 100, 200, 250 and 300 psi pressure to yield a fineness of grind of 4/2. The paste was screen-printed using a 280-mesh screen, a 70-durometer squeegee, on print-print mode, at 10-psi squeegee pressure, on chemically cleaned FR-4 substrates, and with a 40 and 60 mil resistor pattern.

The samples were baked in a forced draft oven at 170° C. for 1 hr. The properties of the resulting cured resistor were:

| | |
| --- | --- |
| Resistance (ohm/square) | 67 |
| Thickness (microns) | 12 |
| HTCR (ppm/° C.) | 138 |
| CTCR (ppm/° C.) | −47 |
| % resistance change of 40 mil resistors after: | |
| Lamination | 33.3 |
| 96 hrs at 85° C./85% RH of laminates | 31.9 |

COMPARATIVE EXAMPLE 2

A PTF resistor paste composition was prepared using the polyimide solution of EXAMPLE 1. This was performed by adding, to the polyimide solution, the additional components listed below.

The PTF resistor paste included one or more metal powders (or metal oxides), hydrophobic thermal crosslinkers, and a blocked aromatic amine catalyst, dimethylbenzylammonium acetate. The PTF resistor paste composition was prepared by mixing the following ingredients in an ambient environment with stirring to give a crude paste mixture.

| Ingredient | % by weight |
| --- | --- |
| Ruthenium dioxide powder | 28.26 |
| Bismuth ruthenate powder | 20.47 |
| Silver powder | 6.58 |
| Alumina powder | 5.86 |
| Polyimide solution | 25.24 |
| Tetramethylbisphenol A | 1.23 |
| SU-8 epoxy resin in 80/20 w/w PGDA/Dowanol ® PPh | 3.63 |
| Desmodur BL4265 65% solids in AR100 | 2.03 |
| Phenoxy resin PKHH 23.89% solids | 3.10 |
| Dimethylbenzylammonium acetate | 0.06 |
| Dibutyltin dilaurate | 0.08 |
| 2-MB | 0.03 |
| 80/20 weight/weight PGDA/Dowanol ® PPh | 3.43 |

The paste composition was 69.8 percent by weight solids.

The PTF resistor paste was used to prepare the PTF resistor. The PTF resistor paste was printed directly onto chemically cleaned copper without a silver immersion process. Silver immersion processes are typically used to pre-treat a copper surface.

The PTF resistor paste was 3-roll milled with a 1 mil gap with 3 passes each set at 0, 50, 100, 200, 250 and 300 psi pressure to yield a fineness of grind of 4/2. The paste was screen-printed using a 180-mesh screen, an 80-durometer squeegee, on print-print mode, at 10-psi squeegee pressure, on chemically cleaned FR-4 substrates, and with a 40 and 60 mil resistor pattern.

The samples were baked in a forced draft oven at 170° C. for 1 hr followed by 2 min at 230° C. cure in air. The properties of the resulting cured PTF resistor were recorded as follows:

| | |
| --- | --- |
| Resistance (ohm/square) | 100 |
| Thickness (microns) | 22 |
| % Resistance change of 40 mil resistors after: | |
| Brown oxide | −3.4 |
| Lamination | −0.2 |
| 100 hrs at 85° C./85% RH | 21.7 |

COMPARATIVE EXAMPLE 3

A PTF resistor paste composition was prepared using the polyimide solution of EXAMPLE 10. This was performed by adding, to the polyimide solution, the additional components listed below.

The PTF resistor paste included one or more metal powders (or metal oxides), hydrophobic or conventional thermal crosslinkers, and an aromatic amine catalyst. The PTF resistor paste composition was prepared by mixing the following ingredients in an ambient environment with stirring to give a crude paste mixture.

| Ingredient | % by weight |
| --- | --- |
| Ruthenium dioxide powder | 22.5 |
| Bismuth ruthenate powder | 11.8 |
| Graphite | 1.5 |

-continued

| Ingredient | % by weight |
| --- | --- |
| Alumina powder | 13.8 |
| Polyimide | 9.8 |
| Bisphenol-A diglycidylether | 1.0 |
| Dimethylbenzylamine | 0.17 |
| butyl carbitol acetate | 39.43 |

COMPARATIVE EXAMPLE 4

The PTF resistor paste of COMPARATIVE EXAMPLE 3 was used to prepare the PTF resistor of COMPARATIVE EXAMPLE 4. The PTF resistor paste was printed directly onto chemically cleaned copper without a silver immersion process. Silver immersion processes are typically used to pre-treat a copper surface.

The PTF resistor paste was 3-roll milled with a 1 mil gap with 3 passes each set at 0, 50, 100, 200, 250 and 300 psi pressure to yield a fineness of grind of 7/2. The paste was screen-printed using a 180-mesh screen, an 80-durometer squeegee, on print-print mode, at 10-psi squeegee pressure, on chemically cleaned FR-4 substrates, and with a 40 and 60 mil resistor pattern.

The samples were baked in a forced draft oven at 170° C. for 1 hr followed by 2 min at 230° C. cure in air. The properties of the resulting cured PTF resistor were recorded as follows:

| Resistance (ohm/square) | 192 |
| --- | --- |
| % Resistance change of 40 mil resistors after | |
| Lamination | 3.8 |
| 120 hrs at 85° C./85% RH | 12.4 |
| Thermal cycling (−25° C. to 125° C., 60 cycles) | −8.4 |

COMPARATIVE EXAMPLE 5

A PTF resistor paste composition was prepared using the polyimide solution of EXAMPLE 10. This was performed by adding, to the polyimide solution, the additional components listed below.

The PTF resistor paste included one or more metal powders (or metal oxides), hydrophobic or conventional thermal crosslinkers, and an aromatic amine catalyst. The PTF resistor paste composition was prepared by mixing the following ingredients in an ambient environment with stirring to give a crude paste mixture.

| Ingredient | % by weight |
| --- | --- |
| Ruthenium dioxide powder | 25.4 |
| Bismuth ruthenate powder | 13.4 |
| Graphite | 1.7 |
| Alumina powder | 15.6 |
| Polyimide | 7.9 |
| Poly(bisphenol A-co-epichlorohydrin)glycidyl end-capped | 4.4 |
| Dimethylbenzylamine | 0.13 |
| butyl carbitol acetate | 31.47 |

COMPARATIVE EXAMPLE 6

The PTF resistor paste of COMPARATIVE EXAMPLE 5 was used to prepare the PTF resistor of COMPARATIVE EXAMPLE 6. The PTF resistor paste was printed directly onto chemically cleaned copper without a silver immersion process. Silver immersion processes are typically used to pre-treat a copper surface.

The PTF resistor paste was 3-roll milled with a 1 mil gap with 3 passes each set at 0, 50, 100, 200, 250 and 300 psi pressure to yield a fineness of grind of 7/2. The paste was screen-printed using a 180-mesh screen, an 80-durometer squeegee, on print-print mode, at 10-psi squeegee pressure, on chemically cleaned FR-4 substrates, and with a 40 and 60 mil resistor pattern.

The samples were baked in a forced draft oven at 170° C. for 1 hr followed by 2 min at 230° C. cure in air. The properties of the resulting cured PTF resistor were recorded as follows:

| Resistance (ohm/square) | 46.3 |
| --- | --- |
| % resistance change of 40 mil resistors after: | |
| Lamination | 4.6 |
| 120 hrs at 85° C./85% RH | 9.7 |
| Thermal cycling (−25° C. to 125° C., 60 cycles) | −4.1 |

COMPARATIVE EXAMPLE 7

A PTF resistor paste composition was prepared using the polyimide solution of EXAMPLE 10. This was performed by adding, to the polyimide solution, the additional components listed below.

The PTF resistor paste included one or more metal powders (or metal oxides), hydrophobic or conventional thermal crosslinkers, and an aromatic amine catalyst. The PTF resistor paste composition was prepared by mixing the following ingredients in an ambient environment with stirring to give a crude paste mixture.

| Ingredient | % by weight |
| --- | --- |
| Ruthenium dioxide powder | 22.4 |
| Bismuth ruthenate powder | 11.8 |
| Graphite | 1.5 |
| Alumina powder | 13.8 |
| Polyimide | 9.8 |
| Trihydroxyphenylethane, glycidyl ether | 1.1 |
| Dimethylbenzylamine | 0.17 |
| butyl carbitol acetate | 39.43 |

COMPARATIVE EXAMPLE 8

The PTF resistor paste of COMPARATIVE EXAMPLE 7 was used to prepare the PTF resistor of COMPARATIVE EXAMPLE 8. The PTF resistor paste was printed directly onto chemically cleaned copper without a silver immersion process. Silver immersion processes are typically used to pre-treat a copper surface.

The PTF resistor paste was 3-roll milled with a 1 mil gap with 3 passes each set at 0, 50, 100, 200, 250 and 300 psi pressure to yield a fineness of grind of 7/2. The paste was screen-printed using a 180-mesh screen, an 80-durometer squeegee, on print-print mode, at 10-psi squeegee pressure, on chemically cleaned FR-4 substrates, and with a 40 and 60 mil resistor pattern.

The samples were baked in a forced draft oven at 170° C. for 1 hr followed by 2 min at 230° C. cure in air. The properties of the resulting cured PTF resistor were recorded as follows:

| Resistance (ohm/square) | 468 |
|---|---|
| % Resistance change of 40 mil resistors after: | |
| Lamination | 2.6 |
| 120 hrs at 85° C./85% RH | 8.8 |
| Thermal cycling (−25° C. to 125° C., 60 cycles) | −6.0 |

COMPARATIVE EXAMPLE 9

A PTF resistor paste composition was prepared using the polyimide solution of EXAMPLE 10. This was performed by adding, to the polyimide solution, the additional components listed below.

The PTF resistor paste included one or more metal powders (or metal oxides), hydrophobic or conventional thermal crosslinkers, and an aromatic amine catalyst. The PTF resistor paste composition was prepared by mixing the following ingredients in an ambient environment with stirring to give a crude paste mixture.

| Ingredient | % by weight |
|---|---|
| Ruthenium dioxide powder | 25.0 |
| Bismuth ruthenate powder | 13.1 |
| Graphite | 1.6 |
| Alumina powder | 15.4 |
| Polyimide | 8.2 |
| NC-3000S epoxidized phenolic resin | 3.9 |
| Dimethylbenzylamine | 0.14 |
| butyl carbitol acetate | 32.64 |

COMPARATIVE EXAMPLE 10

The PTF resistor paste of COMPARATIVE EXAMPLE 9 was used to prepare the PTF resistor of COMPARATIVE EXAMPLE 10. The PTF resistor paste was printed directly onto chemically cleaned copper without a silver immersion process. Silver immersion processes are typically used to pre-treat a copper surface.

The PTF resistor paste was 3-roll milled with a 1 mil gap with 3 passes each set at 0, 50, 100, 200, 250 and 300 psi pressure to yield a fineness of grind of 7/2. The paste was screen-printed using a 180-mesh screen, an 80-durometer squeegee, on print-print mode, at 10-psi squeegee pressure, on chemically cleaned FR-4 substrates, and with a 40 and 60 mil resistor pattern.

The samples were baked in a forced draft oven at 170° C. for 1 hr followed by 2 min at 230° C. cure in air. The properties of the resulting cured PTF resistor were recorded as follows:

| Resistance (ohm/square) | 268 |
|---|---|
| % resistance change of 40 mil resistors after: | |
| Lamination | 6.7 |
| 120 hrs at 85° C./85% RH | 10.4 |
| Thermal cycling (−25° C. to 125° C., 60 cycles) | −12.9 |

COMPARATIVE EXAMPLE 11

A PTF resistor paste composition was prepared using the polyimide solution of EXAMPLE 10. This was performed by adding, to the polyimide solution, the additional components listed below.

The PTF resistor paste included one or more metal powders (or metal oxides), hydrophobic or conventional thermal crosslinkers, and an aromatic amine catalyst. The PTF resistor paste composition was prepared by mixing the following ingredients in an ambient environment with stirring to give a crude paste mixture.

| Ingredient | % by weight |
|---|---|
| Ruthenium dioxide powder | 22.8 |
| Bismuth ruthenate powder | 11.9 |
| Graphite | 1.5 |
| Alumina powder | 13.9 |
| Polyimide | 9.7 |
| Hexafluorobisphenol-A glycidyl ether | 1.3 |
| Dimethylbenzylamine | 0.16 |
| butyl carbitol acetate | 38.74 |

COMPARATIVE EXAMPLE 12

The PTF resistor paste of COMPARATIVE EXAMPLE 11 was used to prepare the PTF resistor of COMPARATIVE EXAMPLE 12. The PTF resistor paste was printed directly onto chemically cleaned copper without a silver immersion process. Silver immersion processes are typically used to pre-treat a copper surface.

The PTF resistor paste was 3-roll milled with a 1 mil gap with 3 passes each set at 0, 50, 100, 200, 250 and 300 psi pressure to yield a fineness of grind of 7/2. The paste was screen-printed using a 180-mesh screen, an 80-durometer squeegee, on print-print mode, at 10-psi squeegee pressure, on chemically cleaned FR-4 substrates, and with a 40 and 60 mil resistor pattern.

The samples were baked in a forced draft oven at 170° C. for 1 hr followed by 2 min at 230° C. cure in air. The properties of the resulting cured PTF resistor were recorded as follows:

| Resistance (ohm/square) | 86.4 |
|---|---|
| % resistance change of 40 mil resistors after | |
| Lamination | 4.7 |
| 120 hrs at 85° C./85% RH | 6.4 |
| Thermal cycling (−25° C. to 125° C., 60 cycles) | −10.6 |

COMPARATIVE EXAMPLE 13

A PTF resistor paste composition was prepared using the polyimide solution of EXAMPLE 10. This was performed by adding, to the polyimide solution, the additional components listed below.

The PTF resistor paste included one or more metal powders (or metal oxides), hydrophobic or conventional thermal crosslinkers, and an aromatic amine catalyst. The PTF resistor paste composition was prepared by mixing the following ingredients in an ambient environment with stirring to give a crude paste mixture.

| Ingredient | % by weight |
| --- | --- |
| Ruthenium dioxide powder | 22.8 |
| Bismuth ruthenate powder | 11.9 |
| Graphite | 1.5 |
| Alumina powder | 13.9 |
| Polyimide | 9.7 |
| SU-8 | 1.3 |
| Dimethylbenzylamine | 0.16 |
| butyl carbitol acetate | 38.74 |

COMPARATIVE EXAMPLE 14

The PTF resistor paste of COMPARATIVE EXAMPLE 13 was used to prepare the PTF resistor of COMPARATIVE EXAMPLE 14. The PTF resistor paste was printed directly onto chemically cleaned copper without a silver immersion process. Silver immersion processes are typically used to pre-treat a copper surface.

The PTF resistor paste was 3-roll milled with a 1 mil gap with 3 passes each set at 0, 50, 100, 200, 250 and 300 psi pressure to yield a fineness of grind of 7/2. The paste was screen-printed using a 180-mesh screen, an 80-durometer squeegee, on print-print mode, at 10-psi squeegee pressure, on chemically cleaned FR-4 substrates, and with a 40 and 60 mil resistor pattern.

The samples were baked in a forced draft oven at 170° C. for 1 hr followed by 2 min at 230° C. cure in air. The properties of the resulting cured PTF resistor were recorded as follows:

| Resistance (ohm/square) | 224 |
| --- | --- |
| % resistance change of 40 mil resistors after: | |
| Lamination | 16.8 |
| 120 hrs at 85° C./85% RH | 8.1 |
| Thermal cycling (−25° C. to 125° C., 60 cycles) | −13.8 |

COMPARATIVE EXAMPLE 15

A PTF resistor paste composition was prepared using the polyimide solution of EXAMPLE 10. This was performed by adding, to the polyimide solution, the additional components listed below.

The PTF resistor paste included one or more metal powders (or metal oxides) and an aromatic amine catalyst. The PTF resistor paste composition was prepared by mixing the following ingredients in an ambient environment with stirring to give a crude paste mixture.

| Ingredient | % by weight |
| --- | --- |
| Ruthenium dioxide powder | 21.7 |
| Bismuth ruthenate powder | 11.3 |
| Graphite | 1.4 |
| Alumina powder | 13.2 |
| Polyimide | 10.4 |
| Dimethylbenzylamine | 0.18 |
| butyl carbitol acetate | 41.82 |

COMPARATIVE EXAMPLE 16

The PTF resistor paste of COMPARATIVE EXAMPLE 15 was used to prepare the PTF resistor of COMPARATIVE EXAMPLE 16.

The PTF resistor paste was printed directly onto chemically cleaned copper without a silver immersion process. Silver immersion processes are typically used to pre-treat a copper surface.

The PTF resistor paste was 3-roll milled with a 1 mil gap with 3 passes each set at 0, 50, 100, 200, 250 and 300 psi pressure to yield a fineness of grind of 7/2. The paste was screen-printed using a 180-mesh screen, an 80-durometer squeegee, on print-print mode, at 10-psi squeegee pressure, on chemically cleaned FR-4 substrates, and with a 40 and 60 mil resistor pattern.

The samples were baked in a forced draft oven at 170° C. for 1 hr followed by 2 min at 230° C. cure in air. The properties of the resulting cured PTF resistor were recorded as follows:

| Resistance (ohm/square) | 402 |
| --- | --- |
| % resistance change of 40 mil resistors after | |
| Lamination | 12.4 |
| 120 hrs at 85° C./85% RH | −0.45 |
| Thermal cycling (−25° C. to 125° C., 60 cycles) | −16.7 |

GLOSSARY OF TERMS

The following glossary contains a list of names and abbreviations for each ingredient used:

| | |
| --- | --- |
| Alumina (R0127) | Non-electrically conductive filler; surface area 7.4 to 10.5 m$^2$/g |
| Barium titanate (Z9500) | Capacitor material from Ferro; surface area 3.6 m$^2$/g, average particle size 1.2 microns |
| Bismuth ruthenate (P2280) | Resistor material made in DuPont Microcircuit Materials; surface area 9-10 m$^2$/g |
| Borchi KAT 22 | Blocked isocyanate catalyst from Bayer Chemicals |
| Desmodur ® BL4265A solution | Blocked isocyanate from Bayer Polymers LLC at 65% solids in AR100 |
| Dimethylbenzylamine | Catalyst for epoxy reaction from Aldrich |
| Epon ® 828 | Bisphenol A/epichlorohydrin based epoxy resin also called bisphenol-A diglycidylether from Shell |
| 2-Ethyl-4-methylimidazole | Catalyst for epoxy reaction from Aldrich |
| Fumed silica (R972) | Viscosity modifier from Degussa; surface area 90-130 m$^2$/g |
| Graphite (R0565) | Resistor material made in DuPont Microcircuit Materials |
| Hexafluorobisphenol-A glycidyl ether | Epoxy from Aldrich |

| | |
|---|---|
| 2-Mercaptobenzimidazole (2-MB) | Adhesion promoter from Aldrich |
| NC-3000S epoxidized phenolic resin | Biphenyl containing epoxy resin considered as a low moisture absorption epoxy from Nippon Kayaku Co. |
| Phenoxy resin PKHH solution | Polyhydroxyphenyl ether from InChem Corp. dissolved at 23.89% solids in 70/30 Dowanol ® DPM/diethylene glycol ethyl ether acetate |
| Poly(bisphenol A-co-epichlorohydrin) glycidyl end-capped | High molecular weight epoxy from Aldrich |
| Propyleneglycol diacetate (PGDA) RSS-1407 | Polyimide solvent from Aldrich |
| | Epoxy resin based on tetramethyl biphenyl from Resolution Performance Products |
| Ruthenium dioxide (P2456) | Resistor material made in DuPont Microcircuit Materials; surface area 12 m²/g |
| Silver (P3023) | Resistor material made in DuPont Microcircuit Materials; surface area 2.2-2.8 m²/g |
| SU-8 | Epoxy resin from Resolution Performance Products |
| Tetramethyl bisphenol A | Phenolic crosslinker from Aldrich |
| Tetramethyl bisphenol A diglycidyl ether | Epoxy resin from Aldrich |
| Trihydroxyphenylethane, glycidyl ether | 1,1,1-tris (p-hydroxyphenyl)ethane glycidyl ether from DuPont Electronic Technologies |

What is claimed is:

1. A screen-printable composition comprising a polyimide component, a sterically hindered hydrophobic epoxy and an organic solvent;

wherein the polyimide component is represented by a polyimide having a repeat unit represented the formula;

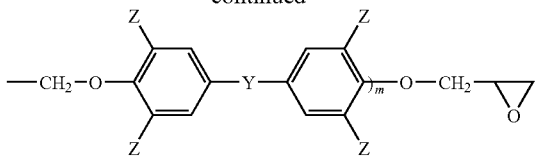

wherein X can be equal to $SO_2$ or $C(CF_3)_2$, $C(CF_3)$phenyl, $C(CF_3)CF_2CF_3$, or $C(CF_2CF_3)$phenyl, and combinations thereof, and wherein Y is derived from a diamine component comprising from between and including any two of the following numbers, 2, 5, 10, 15, 20, 25, 30, 35, 40, 45 and 50 mole percent of a diamine selected from the group consisting of, 2,2'-bis(3-amino-4-hydroxyphenyl)hexafluoropropane (6F-AP), 2,4-diaminophenol, 2,3-diaminophenol, 3,3'-diamino-4,4'-dihydroxy-biphenyl and 2,2'-bis(3-amino-3-hydroxyphenyl)hexafluoropropane;

wherein the sterically hindered epoxy is represented by the following formula,

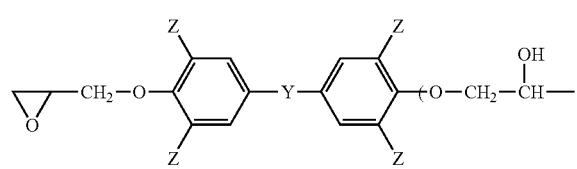

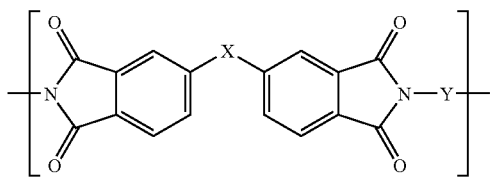

wherein Y is either a covalent bond, oxygen, sulfur, methylene, fluorenylidene, ethylidene, sulfonyl, cyclohexylidene, 1-phenylethylidene, or $C(CH_3)_2$, $C(CF_3)_2$;

wherein Z is an alkyl, alkoxy, phenyl, phenoxy, halogen, or combinations thereof; and wherein m is an integer between and including any two of the following numbers, 0, 1, 2, 3, 4 and 5; and wherein the organic solvent is selected from the group consisting of dibasic acid esters, propyleneglycol diacetate (PGDA), propylene glycol phenyl ether and mixtures of these.

2. A composition in accordance with claim 1 further comprising an electrically conductive material.

3. A composition in accordance with claim 1 wherein the sterically hindered epoxy is selected from the group comprising tetramethyl biphenol epoxy (TMBP), tetramethylbisphenol A epoxy (TMBPA), and tetrabromobisphenol-A epoxy.

4. A composition in accordance with claim 1 wherein the diamine component further comprises from 50 to 98 mole percent of a diamine selected from the group consisting of 3,4'-diaminodiphenyl ether (3,4'-ODA), 4,4'-diamino-2,2'-bis(trifluoromethyl)biphenyl (TFMB), 3,3',5,5'-tetramethylbenzidine, 2,3,5,6-tetramethyl-1,4-phenylenediamine, 3,3'-diaminodiphenyl sulfone, 3,3'dimethylbenzidine, 3,3'-bis(trifluoromethyl)benzidine, 2,2'-bis-(p-aminophenyl)hexafluoropropane, bis(trifluoromethoxy)benzidine (TFMOB), 2,2'-bis(pentafluoroethoxy)benzidine (TFEOB), 2,2'-trifluoromethyl-4,4'-oxydianiline (OBABTF), 2-phenyl-2-trifluoromethyl-bis(p-aminophenyl)methane, 2-phenyl-2-trifluoromethyl-bis(m-aminophenyl)methane, 2,2'-bis(2-heptafluoroisopropoxy-tetrafluoroethoxy)benzidine (DFPOB), 2,2-bis(m-aminophenyl)hexafluoropropane (6-FmDA), 2,2-bis(3-amino-4-methylphenyl)hexafluoropropane, 3,6-bis(trifluoromethyl)-1,4-diaminobenzene (2TFMPDA), 1-(3,5-diaminophenyl)-2,2-bis(trifluoromethyl)-3,3,4,4,5,5,5-heptafluoropentane, 3,5-diaminobenzotrifluoride (3,5-DABTF), 3,5-diamino-5-(pentafluoroethyl)benzene, 3,5-diamino-5-(heptafluoropropyl)benzene, 2,2'-dimethylbenzidine (DMBZ), 2,2',6,6'-tetramethylbenzidine (TMBZ), 3,6-diamino-9,9-bis(trifluoromethyl)xanthene (6FCDAM), 3,6-diamino-9-trifluoromethyl-9-phenylxanthene (3FCDAM), 3,6-diamino-9,9-diphenyl xanthene and combinations thereof.

5. A composition in accordance with claim 1 wherein the polyimide component is derived from a dianhydride component and a diamine component, the diamine comprising from 2 to 50 mole percent of a phenolic containing diamine and the dianhydride component being a dianhydride selected from the group consisting of 3,3',4,4'-diphenylsulfone tetracarboxylic dianhydride (DSDA), 2,2-bis(3,4-dicarboxyphenyl) 1,1,1,3,3,3-hexafluoropropane dianhydride (6-FDA), 1-phenyl -1,1-bis(3,4-dicarboxyphenyl)-2,2,2-trifluoroethane dianhydride, 1,1,1,3,3,4,4,4-octylfluoro-2,2-bis(3,4-dicarboxyphenyl)butane dianhydride, 1-phenyl -2,2,3,3,3-pentafluoro-1,1-bis(3,4-dicarboxylphenyl)propane dianhydride, 4,4'-oxydiphthalic anhydride (ODPA), 2,2'-bis(3,4-dicarboxyphenyl)propane dianhydride, 2,2'-bis(3,4-dicarboxyphenyl)-2-phenylethane dianhydride, 2,3,6,7-tetracarboxy-9-trifluoromethyl-9-phenylxanthene dianhydride (3FCDA), 2,3,6,7-tetracarboxy-9,9-bis(trifluoromethyl)xanthene dianhydride (6FCDA), 2,3,6,7-tetracarboxy-9-methyl-9-trifluoromethylxanthene dianhydride (MTXDA), 2,3,6,7-tetracarboxy-9-phenyl-9-methylxanthene dianhydride (MPXDA), 2,3,6,7-tetracarboxy-9,9-dimethylxanthene dianhydride (NMXDA) and combinations thereof.

6. A composition in accordance with claim 2 wherein the electrically conductive material is a metal oxide.

7. A composition in accordance with claim 2 wherein the electrically conductive material is an oxide of a metal selected from the group consisting of Ru, Pt, Ir, Sr, La, Nd, Ca, Cu, Bi, Gd, Mo, Nb, Cr and Ti.

8. A composition in accordance with claim 2 wherein the electrically conductive material is a material selected from the group consisting of metal carbides, metal nitrides and metal borides.

9. A composition in accordance with claim 2 wherein the electrically conductive material is a material selected from the group consisting of, titanium nitride and carbide, zirconium boride and carbide, and tungsten boride.

10. A composition in accordance with claim 2 wherein the electrically conductive material is a material selected from the group consisting of barium titanate, barium strontium titanate, lead magnesium niobate, barium nitride, aluminum nitride, boron nitride, beryllium oxide, silver, copper, and diamond.

11. A composition in accordance with claim 2 further comprising a non-electrically conductive filler, the filler being selected from the group consisting of talc, fumed silica, silica, fumed aluminum oxide, aluminum oxide, bentonite, calcium carbonate, iron oxide, titanium dioxide, mica and glass.

12. A composition in accordance with claim 2 wherein the electrically conductive material is a material selected from the group consisting of carbon, graphite, carbon nanotubes, multi-wall carbon nanotubes, carbon fiber and carbon nanofibers.

13. A composition in accordance with claim 2 wherein the electrically conductive material is present in an amount ranging from 10, 15, 20, 25, 30, 35, 40, 45, 50, 55, 60, 65, 70, 75 and 80 weight percent of the total weight of the composition.

14. A composition in accordance with claim 1, wherein the organic solvent is a liquid capable of suspending or dissolving the polyimide component, wherein the organic solvent has a Hanson polar solubility parameter between and including any two of the following numbers 2.1, 2.2, 2.3, 2.4, 2.5, 2.6, 2.7, 2.8, 2.9 and 3.0, and wherein the organic solvent has a normal boiling point between and including any two of the following numbers 210, 220, 230, 240, 250 and 260° C.

15. A composition in accordance with claim 1 wherein the organic solvent is a dibasic acid ester selected from the group consisting of dimethyl succinate, dimethyl glutarate, dimethyl adipate and mixtures of these.

16. A composition according to claim 2 wherein the polyimide component and the sterically hindered epoxy component are present at a weight ratio of A:B, wherein A is the polyimide component and B is the epoxy component, and wherein A is between and including any two of the following numbers 1, 2, 3, 4, 5, 10, 12 and 15, and wherein B is 1.0.

17. A composition in accordance with claim 2, having the organic solvent removed, the composition being useful as a component in an electronic circuit package, wherein polyimide component portion and the sterically hindered epoxy component both have a glass transition temperature greater than 250° C. and wherein both have a water absorption factor of 2% or less.

18. A composition in accordance with claim 17, wherein both the polyimide component and the sterically hindered epoxy component both have a glass transition temperature greater than 280° C. and wherein both have a water absorption factor of 1% or less.

19. A composition in accordance with claim 2 further comprising a crosslinking agent selected from the group consisting of blocked isocyanates, polyhydroxystyrene, an epoxidized copolymer of phenol and aromatic hydrocarbon, a reaction product of a epichlorohydrin and a bisphenol, phenol formaldehyde, and 1,1,1-tris(p-hydroxyphenyl)ethane triglycidyl ether.

20. A screen-printable composition comprising a polyimide component, a sterically hindered hydrophobic epoxy and an organic solvent;

wherein the polyimide component is represented by a polyimide having a repeat unit represented the formula;

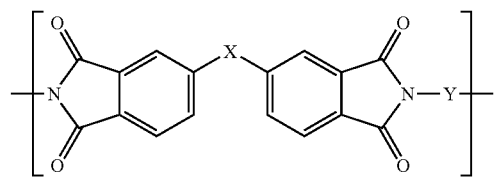

wherein X can be equal to $SO_2$ or $C(CF_3)_2$, $C(CF_3)$phenyl, $C(CF_3)CF_2CF_3$, or $C(CF_2CF_3)$phenyl, and combinations thereof, and wherein Y is derived from a diamine component comprising from between and including any two of the following numbers, 2, 5, 10, 15, 20, 25, 30, 35, 40, 45 and 50 mole percent of a diamine selected from the group consisting of, 2,2'-bis(3-amino-4-hydroxyphenyl)hexafluoropropane (6F-AP), 2,4-diaminophenol, 2,3-diaminophenol, 3,3'-diamino-4,4'-dihydroxy-biphenyl and 2,2'-bis(3-amino-3-hydroxyphenyl)hexafluoropropane;

wherein the sterically hindered epoxy is represented by the following formula,

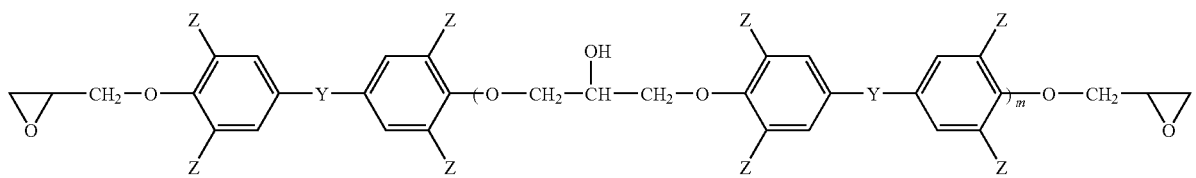

wherein Z is an alkyl, alkoxy, phenyl, phenoxy, halogen, or combinations thereof;

wherein Y is either a covalent bond, oxygen, sulfur, methylene, fluorenylidene, ethylidene, sulfonyl, cyclohexylidene, 1-phenylethylidene, or $C(CH_3)_2$, $C(CF_3)_2$; and wherein m is an integer between and including any two of the following numbers, 0, 1, 2, 3, 4 and 5; and wherein the organic solvent is selected from the group consisting of dibasic acid esters, propyleneglycol diacetate (PGDA), propylene glycol phenyl ether and mixtures of these, said composition further comprising a sterically hindered phenol represented by the following formula,

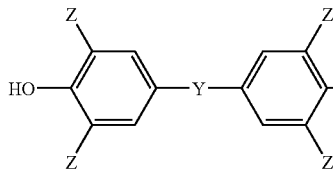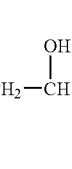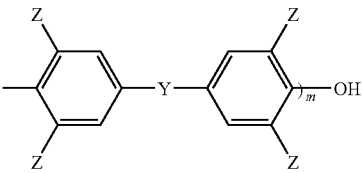

wherein Z is an alkyl, alkoxy, phenyl, phenoxy, halogen or combinations thereof, wherein Y is a covalent bond, oxygen, sulfur, methylene, fluorenylidene, ethylidene, sulfonyl, cyclohexylidene, 1-phenylethylidene, $C(CH_3)_2$, or $C(CF_3)_2$, and, wherein m is an integer between and including any two of the following numbers 0, 1, 2, 3, 4 and 5.

21. A composition in accordance with claim 2 further comprising a sterically hindered phenol selected from the group consisting of 3,3',5,5'-tetramethylbiphenol-4,4'-diol, 4,4'-isopropylidenebis(2,6-dimethylphenol), and 4,4'-isopropylidenebis(2,6-dibromophenol).

22. A composition in accordance with claim 2 further comprising an adhesion promoter selected from the group consisting of polyhydroxyphenylether, polybenzimidazole, polyetherimide, polyamideimide, PKHH-polyhydroxyphenyl ether, 2-amino-5-mercaptothiophene, 5-amino-1,3,4-thiodiazole-2-thiol, benzotriazole, 5-chloro-benzotriazole, 1-chloro-benzotriazole, 1-carboxy- benzotriazole, 1-hy droxy-benzotriazole, 2-mercaptobenzoxazole, 1H-1,2,4-triazole-3-thiol, and mercaptobenzimidazole.

23. A composition in accordance with claim 2 further comprising a tertiary aromatic amine catalyst or the salt of a tertiary aromatic amine catalyst.

24. A composition in accordance with claim 2 further comprising a catalyst selected from the group consisting of dimethylbenzylamine and dimethylbenzylammonium acetate.

25. A composition in accordance with claim 2, having the organic solvent removed, wherein the remaining composition is used in integrated circuitry, chip-scale packaging and wafer-level packaging as semiconductor stress buffers, interconnect dielectrics, protective overcoats, bond pad redistributors, or solder bump under fills.

26. A composition in accordance with claim 2, having the organic solvent removed wherein the remaining composition is used as a binder in a polymer thick film (PTF) resistor, polymer thick film (PTF) electrical conductor, a discrete capacitor, a planar capacitor, a coating in an electronic device, a film, a substrate in an electronic device, an encapsulant, an adhesive, and as an electrically or thermally conductive material.

27. A composition in accordance with claim 2, having the organic solvent removed, wherein the remaining composition is used in a printed circuit board (PCB) or embedded into a multi-layer circuit board.

28. A composition in accordance with claim 2 screen-printed onto non metal-plated copper.

* * * * *